US008486548B2

(12) United States Patent
Ueda et al.

(10) Patent No.: US 8,486,548 B2
(45) Date of Patent: Jul. 16, 2013

(54) BATTERY STORAGE SYSTEM

(75) Inventors: Masahiro Ueda, Hitachinaka (JP); Yoshinori Aoshima, Hitachinaka (JP)

(73) Assignees: Hitachi, Ltd., Tokyo (JP); Hitachi Vehicle Energy, Ltd., Hitachinaka-shi (JP)

(*) Notice: Subject to any disclaimer, the term of this patent is extended or adjusted under 35 U.S.C. 154(b) by 366 days.

(21) Appl. No.: 12/626,206

(22) Filed: Nov. 25, 2009

(65) Prior Publication Data

US 2010/0136390 A1    Jun. 3, 2010

(30) Foreign Application Priority Data

Nov. 28, 2008 (JP) ................. 2008-304285

(51) Int. Cl.
*H01M 2/00* (2006.01)
*H01M 10/48* (2006.01)

(52) U.S. Cl.
USPC ................. 429/61; 429/90; 429/92

(58) Field of Classification Search
None
See application file for complete search history.

(56) References Cited

U.S. PATENT DOCUMENTS

| 2003/0129457 | A1  | 7/2003 | Kawai et al. |
| 2005/0077874 | A1* | 4/2005 | Nakao ............................ 320/116 |
| 2005/0084745 | A1* | 4/2005 | Colello et al. .................. 429/61 |
| 2008/0048619 | A1  | 2/2008 | Yoshida |

FOREIGN PATENT DOCUMENTS

| JP | 2000-357541 A | 12/2000 |
| JP | 2003-209932 A | 7/2003 |
| JP | 2007-151396 A | 6/2007 |
| JP | 2008-43188 A | 2/2008 |

OTHER PUBLICATIONS

Japanese Office Action dated Mar. 12, 2013 w/ English translation (five (5) pages).

* cited by examiner

*Primary Examiner* — Barbara Gilliam
*Assistant Examiner* — Adam A Arciero
(74) *Attorney, Agent, or Firm* — Crowell & Moring LLP

(57) ABSTRACT

A battery storage system includes: a plurality of battery modules that are electrically connected in series and in parallel, each comprising a plurality of battery cells; a plurality of sensors provided to each of the plurality of battery modules, that output at least signals corresponding to voltage and current of the each of the battery modules; a plurality of first control devices each of which is provided to the each of the plurality of battery modules, and obtains a power that can be inputted and outputted to and from the each of the battery modules based upon the voltage and current obtained from the output signals of the sensors of the each of the battery modules; and a second control device that performs overall control of the plurality of first control devices, and if a fault of a sensor in any one of the plurality of battery modules has occurred, the second control device obtains a total power that can be inputted and outputted to and from the all of the battery modules, based upon powers each of which can be inputted and outputted to and from each of other battery modules than a battery module in which the sensor has detected the fault, and outputs information of the total power.

7 Claims, 10 Drawing Sheets

BATTERY STORAGE SYSTEM

INCORPORATION BY REFERENCE

The disclosure of the following priority application is herein incorporated by reference: Japanese Patent Application No. 2008-304285, filed Nov. 28, 2008.

BACKGROUND OF THE INVENTION

1. Field of the Invention

The present invention relates to a technique related to a battery storage system, and, as a representative, relates to a technique for impeding deterioration of the function of the device as a power supply.

2. Description of Related Art

As a battery storage system in which a plurality of battery modules are electrically connected in series-parallel and that can supply high power, there is known, for example, the one disclosed in Japanese Laid-Open Patent Publication 2007-151396. In this Japanese Laid-Open Patent Publication 2007-151396, there is disclosed a technique of monitoring the operating conditions of the battery modules by detecting voltage, current, and temperature for each battery module with sensors of various types.

SUMMARY OF THE INVENTION

However, with a battery storage system in which a plurality of battery modules are electrically connected in series-parallel and that can supply high power, as in Japanese Laid-Open Patent Publication 2007-151396, if a fault has been detected in one of the battery modules, then, in the prior art, control has been performed so as to stop input and output to and from the battery storage system even if the rest of the battery modules are operating normally, and accordingly it has not been possible to utilize the remainder of the battery modules, that are still in good order.

According to the 1st aspect of the present invention, a battery storage system comprises: a plurality of battery modules that are electrically connected in series and in parallel, each comprising a plurality of battery cells; a plurality of sensors provided to each of the plurality of battery modules, that output at least signals corresponding to voltage and current of the each of the battery modules; a plurality of first control devices each of which is provided to the each of the plurality of battery modules, and obtains a power that can be inputted and outputted to and from the each of the battery modules based upon the voltage and current obtained from the output signals of the sensors of the each of the battery modules; and a second control device that performs overall control of the plurality of first control devices, and if a fault of a sensor in any one of the plurality of battery modules has occurred, the second control device obtains a total power that can be inputted and outputted to and from the all of the battery modules, based upon powers each of which can be inputted and outputted to and from each of other battery modules than a battery module in which the sensor has detected the fault, and outputs information of the total power.

According to the 2nd aspect of the present invention, in the battery storage system according to the 1st aspect, it is preferred that the second control device reduces the total power according to a degree of fault of the sensor.

According to the 3rd aspect of the present invention, in the battery storage system according to the 2nd aspect, it is preferred that the second control device reduces the total power according to a number of sensors that have been determined as being faulty.

According to the 4th aspect of the present invention, in the battery storage system according to the 2nd aspect, it is preferred that the second control device reduces the total power according to a type of the sensor that has been determined as being faulty.

According to the 5th aspect of the present invention, in the battery storage system according to the 1st aspect, it is preferred that the battery storage system further comprises sensors that detect voltage and current of all of the battery modules.

DESCRIPTION OF THE PREFERRED EMBODIMENTS

In the following, an embodiment of the present invention will be explained.

In the embodiments explained below, the present invention is explained by giving an example of use thereof as a drive power supply for a drive system for a large sized hybrid vehicle.

Such a large sized hybrid vehicle may be a public vehicle such as a hybrid bus or the like, or a cargo vehicle such as a hybrid truck or the like. The embodiment below will be described in terms of a hybrid bus.

Moreover, the structure of the embodiment described below may also be applied to a railroad vehicle or the like, such as a hybrid train or the like.

This embodiment will now be explained in concrete terms with reference to the drawings.

<General Structure of this Drive System for a Large Sized Electric Hybrid Vehicle>

Figure 1:
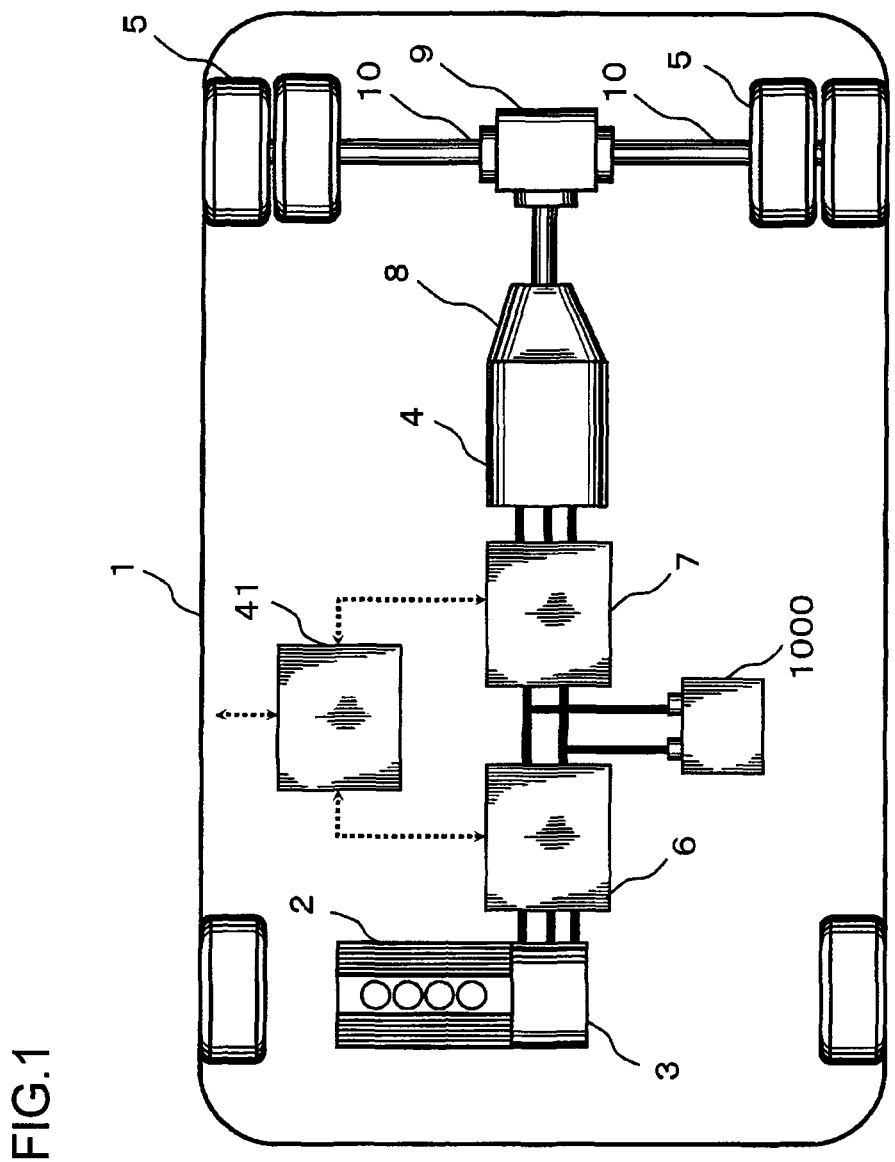
FIG. 1 shows an embodiment of the present invention, wherein the configuration of a drive system for a large size hybrid vehicle is given in a block diagram.

First, the general layout of a drive system for a large sized electric hybrid vehicle will be explained with reference to FIG. 1.

The drive system of the hybrid vehicle 1 of this embodiment is constructed according to the so called series hybrid principle, in which energy flows in series from an engine 2 to drive wheels 5: a generator 3 is driven using the rotational power of the engine 2, that is an internal combustion engine; a motor-generator 4 is driven using the power generated by this driving of the generator 3; and drive wheels 5 (for example the rear wheels of the vehicle) are driven using rotational power generated by this driving of the motor-generator 4. According to a drive system according to this series hybrid principle, since it is possible to operate the engine 2 in a steady manner in a region in which fuel consumption and exhaust gas quality are most satisfactory, with no direct relationship to driving of the drive wheels 5, accordingly, along with it being possible to improve the fuel consumption as compared with a conventional engine driven vehicle, also it is possible to reduce the amount of nitrogen oxides and so on included in the exhaust gases by half or more.

For a drive system for a hybrid vehicle, it would also be acceptable to employ either: the so-called parallel hybrid principle, in which an engine and a motor-generator are arranged in parallel with respect to the flow of energy to the drive wheels (in terms of construction, the engine and the motor-generator are connected in series via a clutch), so that it is possible to drive the drive wheels by the rotational power of the engine, or by the rotational power of the motor-generator, or by the rotational power of both the engine and the motor-generator; or the series-parallel hybrid principle that is a combination of the series hybrid principle with this parallel hybrid principle (in which it is arranged to branch off part of the rotational power of the engine to an electrical generator for generation of electricity, so that this power is used for generation of electricity, and so that, due to this, it is possible to drive a motor-generator for driving the vehicle with the power thus obtained).

The engine 2 and the generator 3 are provided as a dedicated power generation facility that generates the power needed for driving the motor-generator 4. The engine 2 and the generator 3 are mutually mechanically connected by their rotation shafts being directly coupled together. For this mechanical coupling of the engine 2 and the generator 3, it would also be acceptable to employ a method of fixing pulleys on each of the rotation shafts of the engine 2 and the pulley 3, and linking them together with a belt.

The engine 2 is a diesel engine that serves as a drive power source for generating the rotational power necessary for driving the generator 3, and that converts thermal energy obtained by combusting a mixture gas of diesel oil and air to mechanical energy (rotational power). It would also be acceptable to use a gasoline engine, a gas engine, a bio-fuel engine, a hydrogen engine or the like as the engine 2. Moreover, it would also be acceptable to arrange to employ some other type of drive power source such as a gas turbine or the like, instead of the engine 2. The drive power produced by the engine 2 is controlled by the driving of a plurality of air valves (throttle valves and intake- and exhaust valves) and the driving of a fuel valve by an engine control device, not shown in the figures, and is controlled by the amount of fuel supplied to the cylinders and by intaking- and outtaking of air.

The generator 3 is a rotating electrical machine that receives the rotational power outputted from the engine 2 and is driven thereby, and that generates the power needed for driving the motor-generator 4; and, in structure, is a three phase AC synchronous rotating electrical machine of the permanent magnet field type that generates three phase AC power using the magnet flux of permanent magnets. For this generator 3, it would also be acceptable to arrange to employ a coil magnet field type three phase AC synchronous rotating electrical machine that generates three phase AC power using magnetic flux produced by exciting coils, or a three phase AC induction type rotating electrical machine or the like. The generation of power by the generator 3 is controlled by the rotational power outputted from the engine 2, and is controlled by controlling the rotational speed of the generator 3. Moreover, in the case of generating power with a coil magnet field type three phase AC synchronous rotating electrical machine, it is also controlled by controlling the field current that flows in the field coil, simultaneously with controlling the rotational speed of the generator.

It should be understood that, when starting the engine 2, it would also be acceptable to utilize the generator 3 as an electric motor for engine starting, i.e. in order to generate rotational power for starting the engine 2.

A battery storage system (a battery device) 1000, that is a power supply device, is electrically connected to the generator 3 via a first power conversion device 6. And the motor-generator 4 is connected to the battery storage system 100 via a second power conversion device 7.

The first and second power conversion devices 6 and 7 are control devices that control transfer of power between the generator 3, the battery storage system 1000, and the motor-generator 4, and they include power conversion circuits that include a plurality of semiconductor switching elements (for example MOSFETs: metal oxide semiconductor field effect transistors, or IGBTs: Insulated Gate Bipolar Transistors). The power conversion circuit of the first power conversion device 6 includes a three phase bridge circuit in which three series circuits (one for each phase, i.e. each constituting an arm for one phase) are electrically connected in parallel, with two semiconductor switching elements (one for an upper arm and one for a lower arm) being electrically connected in series in each of these series circuits. And, by controlling the ON/OFF operation of these six semiconductor switching elements, this power conversion circuit converts power between the generator 3 and the battery storage system 1000. Furthermore, the power conversion circuit of the second power conversion device 7 also has a similar structure, and converts power between the battery storage system 1000 and the motor-generator 4 by controlling the ON/OFF operation of its six semiconductor switching elements.

The sides of the upper arms opposite to the connection sides of the lower arms are electrically connected to a DC positive side terminal of the battery storage system 1000, while the sides of the lower arms opposite to the connection sides of the upper arms are electrically connected to a DC negative side terminal of the battery storage system 1000. The midpoints of the arms in the power conversion circuit of the first power conversion device 6, in other words the connection sides of arms and lower arms, are electrically connected to the generator 3. And the midpoints of the arms of the power conversion circuit of the second power conversion device 7, in other words the connection sides of upper arms and lower arms, are electrically connected to the motor-generator 4.

Smoothing capacitors are electrically connected in parallel between the DC positive side terminals and the DC negative side terminals of each of the power conversion circuits. These smoothing capacitors are provided in order to suppress voltage fluctuations generated by the high speed ON/OFF switching operation of the semiconductor switching elements included in these power conversion circuits, and by parasitic inductances in their conversion circuitry. Electrolytic capacitors or film capacitors may be used for these smoothing capacitors.

During generation of power by the generator 3, the first power conversion device 6 that is electrically provided between the generator 3 and the battery storage system 1000 functions as an AC-DC conversion circuit (a rectification circuit) that converts the three phase AC power outputted from the generator 3 to DC power; and, during operation of the generator 3 as an electric motor for engine starting, it functions as a DC-AC conversion circuit (an inverter) that converts the DC power outputted from the battery storage system 1000 into three phase power. On the DC side of this first power conversion device 6, it is electrically connected to the positive and negative terminals of a battery module of the battery storage system 1000. And each of three armature coils of the generator 3 for the three phases is electrically connected to the intermediate point of one of the three series circuits (i.e. between one pair of semiconductor switching elements) included in the power conversion circuit of this first power conversion device 6.

During operation of the motor-generator 4 as an electric motor, the second power conversion device 7 that is electrically provided between the battery storage system 1000 and the motor-generator 4 functions as a DC-AC conversion circuit that converts the DC power outputted from the battery storage system 1000 to three phase AC power; and, during operation of the motor-generator 4 as a generator when performing regenerative braking, this second power conversion device 7 functions as an AC-DC conversion circuit that converts the three phase power outputted from the motor-generator 4 into DC power. On the DC side of this second power conversion device 7, it is electrically connected to the positive and negative terminals of a battery module of the battery storage system 1000. And each of three armature coils of the motor-generator 4 for the three phases is electrically connected to the intermediate point of one of the three series circuits (i.e. between one pair of semiconductor switching elements) included in the power conversion circuit of this second power conversion device 7.

It should be understood that while, here, an example is described in which the first and second power conversion devices 6 and 7 are built as separate units, it would also be acceptable to provide a structure in which they are built as a single unit.

The motor-generator 4 is a source of rotational power for driving the drive wheels 5, and includes an armature (a stator) and a magnetic field system (a rotor) that is rotatably supported so as to oppose the armature; in more detail, this motor-generator 4 is a permanent magnet field type three phase AC synchronous rotating electrical machine that generates the rotational power needed for driving the drive wheels 5, on the basis of the magnetic interaction between a rotating magnetic field that is generated by the three phase AC power supplied to its fixed armature coils and that rotates at synchronous speed, and the magnetic flux of a permanent magnet fitted to its rotor.

And, when the motor-generator 4 is being driven as an electric motor, its armature receives the three phase AC power controlled by the second power conversion device 7 and generates a rotating magnetic field; while, when this motor-generator 4 is being driven as a generator, due to interlinking magnetic flux, three phase AC power is generated in its armature, that includes an iron armature core (a stator core) made from a magnetic material and three phase armature coils (stator coils) fitted onto the armature iron core. And the field coils are elements that generate magnetic flux when the motor-generator 4 is being driven either as an electric motor or as a generator, and includes an iron field core (an iron rotor core) that is made from a magnetic material, and a permanent magnet that is fitted to this iron field core.

For the motor-generator 4, it would also be acceptable to employ a coil magnetic field type three phase AC synchronous rotating electrical machine that generates rotational power on the basis of magnetic interaction between a rotating magnetic field created by three phase AC power supplied to an armature coils and rotating at synchronous speed, and magnetic flux produced by excitation of coils, or a three phase AC induction type rotating electrical machine or the like. In the case of a coil magnetic field type three phase AC synchronous rotating electrical machine, the structure of the armature is fundamentally the same as that of a permanent magnet field type three phase AC synchronous rotatory electrical machine. On the other hand, the structure of the magnetic field system is different, since coils for magnetic field system (rotor coils) are wound upon an iron field core, that is a magnetic material. It should be understood that, with such a coil magnetic field type three phase AC synchronous rotating electrical machine, sometimes a permanent magnet is also installed to the iron field core upon which the coils of magnetic field system are wound, so as to repress leakage of magnetic flux from the coils. Magnetic flux is generated by the coils of magnetic field receiving supply of magnetic field current from an external power supply, thus being excited.

This motor-generator 4 is mechanically connected to the wheel axles 10 of the drive wheels 5 via a transmission 8 and a differential gear 9. The transmission 8 transmits the rotational power outputted from the motor-generator 4 to the differential gear 9, while changing the speed thereof. The differential gear 9 transmits this rotational power outputted from the transmission 8 to the left and right wheel axles 10. The motor-generator 4 and the transmission 8 could also be build as a single unit. The transmission 8 and the differential gear 9 are mechanically connected together by a propeller shaft.

The battery storage system 1000 is a battery system that consists of several hundreds of lithium-ion batteries, so as to have a high rated voltage, for example 600 V or greater. And the battery storage system 1000 is an onboard power supply for powering the vehicle by discharging the power required when the motor-generator 4 is being driven, while being charged up with power to be used for powering the motor-generator 4 by the power generated by the motor-generator 4 during power regeneration and by the power generated by the generator 3.

It should be understood that the detailed structure of the battery storage system 1000 will be described hereinafter.

Apart from the motor-generator 4 and the generator 3, electrically operated actuators that supply power to onboard auxiliary machinery (for example, a power steering device and air brakes and so on) and a low voltage battery or the like that is an auxiliary power supply for supplying driving power to electrical equipment in the vehicle (for example, lights, audio, or onboard electronic control devices), whose rated voltages are lower than that of the battery storage system 1000, are electrically connected to the battery storage system 1000 via a DC/DC converter. This DC/DC converter is a voltage raising and lowering device that drops the output voltage of the battery storage system 1000 and supplies it to the electrically operated actuators and the low voltage battery or the like, and also raises the output voltage of the low voltage battery and supplies it to the battery storage system or the like; this DC/DC converter sometimes may also be fitted in the same chassis as the battery storage system 1000. A lead-acid battery of rated voltage 24 V may be used as this low voltage battery. However, for the low voltage battery, it would also be acceptable to use a lithium-ion battery or a nickel-hydrogen battery having the same rated voltage.

The motor-generator 4, the first and second power conversion devices 6 and 7, the generator 3, the engine 2, and the speed change mechanism 8 are disposed in the neighborhood of the differential gear 9, under the floor of the vehicle. And, in the case of a hybrid bus or a hybrid train of the non-step type or the low floor type, the battery storage system 1000 may be provided on a storage unit that is provided on the roof of the vehicle. In this case, the storage unit is shaped so as to project above the roof. On the other hand, in the case of a hybrid bus of the step type or the high floor type, the battery storage system 1000 may be provided below the floor of the vehicle, and in the neighborhood of the first and second power conversion devices 6 and 7. By providing the battery storage system 1000 in the neighborhood of the first and second power conversion devices 6 and 7, it is possible to shorten the length of the electrical wiring between the first and second power conversion devices 6 and 7 and the battery storage system 1000, and thus it is possible to reduce the inductance of this wiring.

When during powered running of the hybrid vehicle 1 (starting off from rest, acceleration, normal traveling, and so on) the operation of the second power conversion device 7 is controlled by a positive torque command being supplied to a motor control device 11 (see FIG. 2), the DC power stored in the battery storage system 1000 is converted into three phase AC power by the second power conversion device 7, and is supplied to the motor-generator 4. Due to this, the motor-generator 4 is driven and rotational power is generated. This generated rotational power is transmitted to the wheel axles 10 via the speed change mechanism 8 and the differential gear 9, and drives the drive wheels 5. When, due to this driving, the state of charge of the battery storage system 1000 has decreased, the generator 3 is driven by the operation of the engine 2, and three phase AC power is generated. This generated three phase power is converted into DC power by the first power conversion device 6, and is stored in the battery storage system 1000, that is thus charged up.

When during regeneration by the hybrid vehicle 1 (deceleration, braking, and so on) the operation of the second power conversion device 7 is controlled by a negative torque command being supplied to the motor control device 11, the three phase AC power generated from the motor-generator 2 that is being driven by the rotational power of the drive wheels 5 is converted into DC power, and is supplied to the battery storage system 100. Due to this, this converted DC power is stored in the battery storage system 1000, that is thus charged up.

The motor control device 11, along with calculating a current command value from a torque command value outputted from a higher level control device, also calculates a voltage command value on the basis of the difference between the current command value and the actual current flowing between the motor-generator 4 and the second power conversion device 7, and generates PWM (Pulse Width Modulation) signals on the basis of this calculated voltage command value and outputs this signal to the first and second power conversion devices 6 and 7.

<Overall Structure of the Battery Storage System 1000>

Figure 2:
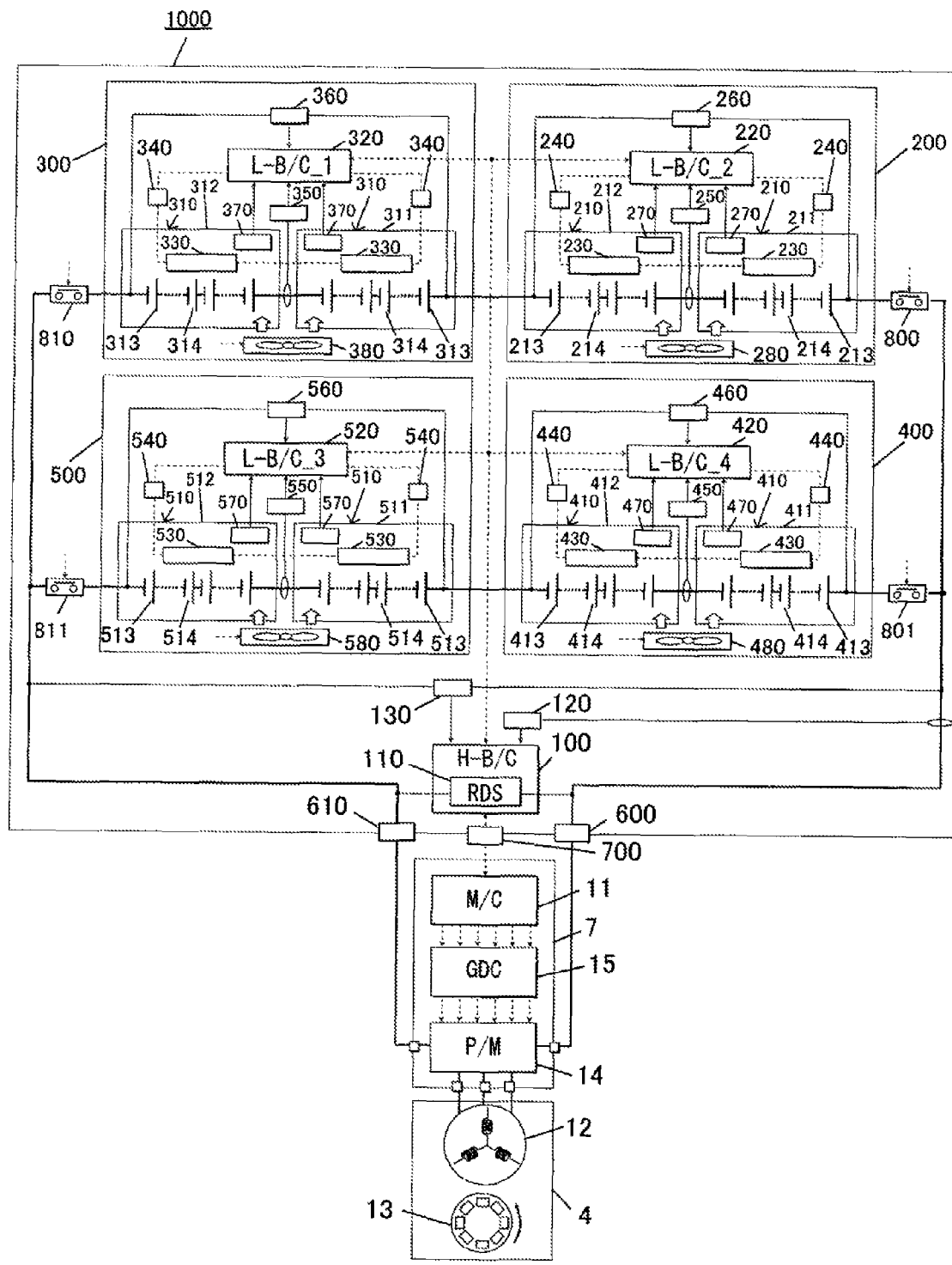
FIG. 2 is a circuit diagram of the electrical connection structure of a battery storage system that is mounted as a drive power supply in FIG. 1.

Next, the overall structure of the battery storage system 1000 will be explained using FIG. 2.

As previously described, this battery storage system 1000 is an onboard power supply for the motor-generator 4, and is electrically connected to the motor-generator 4 (to its armature 12) via the second power conversion device 7, so that its charging and discharging are controlled by the second power conversion device 7. The battery storage system 1000 may be broadly divided up as including an master battery control device 100 for the battery as a whole (i.e. a higher level battery control device), a battery module portion that is made from four battery module sets 200, 300, 400, and 500 connected in series-parallel, and first and second positive side main contactors 800 and 801 and first and second negative side main contactors 810 and 811 for controlling electrical connection between the battery module portion and positive and negative terminals 600 and 610. The reference symbol 13 denotes a magnetic field system that includes a plurality of permanent magnets.

The second power conversion device 7 is an electronic device that, by the operation (turning ON and OFF) of semiconductor switching elements, controls the previously described power conversion (conversion of DC power into three phase AC power, or the converse conversion of three phase AC power into DC power), and includes a power module 14 and a driver device 15.

The power module 14 is a component that constitutes the power conversion circuit previously described, and its positive and negative DC electrode sides respectively are electrically connected via the first and second positive side main contactors 800 and 801 and the first and second negative side main contactors 810 and 811 to the positive and negative terminals 600 and 601 that are provided upon the chassis of the battery storage system 1000. Furthermore, this power module 14 performs ON/OFF switching operation according to six drive signals outputted from the driver device 15, one for each of its six arms (each arm including one semiconductor switching element), and thereby converts the DC power outputted from the battery module portion into three phase AC power that it outputs to the motor-generator 4, or conversely converts the three phase AC power outputted from the motor-generator 4 into DC power that it outputs to the battery storage system 1000.

The driver device 15 generates six drive signals for operating the power module 14 on the basis of command signals (PWM signals) outputted from the motor control device 11, and outputs these six drive signals that it generates to the respective gate electrodes of the six semiconductor switching elements. The six semiconductor switching elements are thus turned ON and OFF on the basis of these drive signals outputted from the driver device 15.

The battery module portion is a battery unit that consists of the four battery module sets 200, 300, 400, and 500 electrically connected in series and in parallel, and includes a first battery module block and a second battery module block. The first battery module block consists of the two battery module sets 200 and 300 electrically connected in series. In a similar manner, the second battery module block consists of the two battery module sets 400 and 500 electrically connected in series. And the first battery module block and the second battery module block are electrically connected in parallel.

The first and second positive side main contactors 800 and 801 respectively are provided between the positive sides of the first and second battery module blocks and the positive terminal 600. And the first and second negative side main contactors 810 and 811 respectively are provided between the negative sides of the first and second battery module blocks and the negative terminal 610. The opening and closing of these contactors is controlled by the master battery control device 100, on the basis of opening and closing command signals outputted from a higher ranking control device.

The battery module set 200 is provided with a assembled battery module 210, and with a battery module set control device for managing and controlling the states of this assembled battery module 210.

It should be understood that the battery module sets 300, 400, and 500 have the same structure as the battery module set 200. In the following explanation of the structures of the battery module sets, therefore, only the structure of the battery module set 200 will be explained, as a representative. Thus, in the three or four digit reference numbers for elements of the battery module sets 300, 400, and 500 that have the same structure as the battery module set 200, the last two or three digits are the same for each battery module set. But the leading digit in each reference number is the identifying digit for that battery module set.

The assembled battery module 210 includes two assembled battery blocks (or assembled battery packs), in other words a high potential side assembled battery block 211 and a low potential side assembled battery block 212, that are electrically connected in series. Each of these assembled battery blocks holds assembled batteries. Each of these battery groups consists of a plurality of lithium battery cells (lithium cells) that are electrically connected in series.

The battery module set control device consists of a local battery control device (a lower level battery control device) 220 that is on a lower level than the master battery control device 100, and a cell control device 230 that is on an even lower level than that local battery control device 220.

The local battery control device 220 is a device for performing management and control of the state of the assembled battery module 210, and also for notifying the state of the assembled battery module 210 and so on to the master battery control device 100. In this management and control of the state of the assembled battery module 210, the total voltage, total current, temperature and so on of the assembled battery module 210 are measured, the state of charge (SOC) and the state of health (SOH) and so on of the assembled battery module 210 are calculated, commands are outputted to the cell control device 230, and so on.

The charge or discharge current of the assembled battery module 210 is detected by the local battery control device 220 on the basis of the output signal from a current sensor 250 that is electrically connected in series between the high potential side assembled battery block 211 and the low potential side assembled battery block 212. And the total voltage of the assembled battery module 210 is detected by the local battery control device 220 on the basis of the output signal of a voltage sensor 260 that is electrically connected in parallel between the positive and negative electrodes of the assembled battery module 210. Moreover, the temperature of the assembled battery module 210 is detected by the local battery control device 220 on the basis of the output signals of a plurality of temperature sensors 270 that are provided to both the high potential side assembled battery block 211 and the low potential side assembled battery block 212. The total voltages, the charge or discharge currents, and the temperatures detected by the lower level battery controllers are transmitted as information to the master battery control device 100.

The cell control device 230 is a device for managing and controlling the states of a plurality of lithium battery cells according to commands from the local battery control device 220, and consists of a plurality of integrated circuits (ICs). This management and control of the states of a plurality of lithium cells includes measurement of the voltage of each lithium battery cell, regulation of the state of charge of each lithium battery cell, and so on. The integrated circuits are set up so as to correspond to the plurality of lithium cells, and perform management and control of states corresponding to those lithium battery cells to which they correspond.

The battery for auxiliary machinery, that is mounted as a power supply for onboard auxiliary machinery such as for example lights and an audio device and so on, is used as the power supply of this local battery control device 220 (in the case of a large sized vehicle, two nominal 12 V batteries are connected in series to constitute a 24 V battery). Due to this, the voltage from this battery for auxiliary machinery (for example 24V) is supplied to the local battery control device 220. And this local battery control device 220 lowers the supplied voltage (for example to 5 V) with a power supply circuit that consists of a DC/DC converter (a DC-DC power converter), and supplies this lowered voltage as a drive voltage to electronic components that make up the local battery control device 220. The electronic components that make up the local battery control device 220 operate due to this.

As a power supply for the integrated circuitry that makes up the cell control device 230, the plurality of corresponding lithium battery cells are used. Due to this, the cell control device and the assembled battery module 210 are electrically connected together via connection lines (also termed "voltage detection lines", not shown in the figure). The voltage of the highest potential one of the plurality of corresponding lithium battery cells is supplied via connection lines to the integrated circuits. And the integrated circuits lower this supplied voltage (for example to 5 V) with a power supply circuit, and use this as their operating power supply.

The master battery control device 100 is an electronic circuit device that, along with monitoring the state of charge and the operational state and so on of each of the four battery module sets 200, 300, 400, and 500 that make up the battery module portion by implementing communication in parallel with each of these four battery module sets 200, 300, 400, and 500, also performs regulation of the state of charge and anomaly detection and so on for each of the four battery module sets 200, 300, 400, and 500; and it consists of a plurality of electronic circuit components including a microcomputer, implemented upon a circuit substrate. Moreover, this master battery control device 100 controls the opening and closing of the first and second positive side main contactors 800 and 801 and the first and second negative side main contactors 810 and 811, on the basis of control signals from a higher ranking control device. Furthermore the master battery control device 100, along with implementing communication with the higher ranking control device and outputting to the higher ranking control device information specifying the permitted charge or discharge power or the permitted charge or discharge current that can be supplied from the battery module portion or that may be received by the battery module portion, and/or an anomaly detection result, information about the state of charge of the battery module portion, and so on, also inputs a start signal and command signals and so on for opening and closing the first and second positive side main contactors 800, 801 and the first and second negative side main contactors 810 and 811, on the basis of operation of an ignition key switch. By a higher ranking control device is meant the motor control device 11, or a yet higher ranking vehicle control device or the like.

Furthermore, the master battery control device 100 includes a leakage detector 110. This leakage detector 110 is provided between the first and second positive side main contactors 800, 801 and the first and second negative side main contactors 810 and 811, and the power module 14, and is an electric circuit for detecting the presence or absence of leakage between the battery module portion and the vehicle body earth, and includes resistance voltage divider circuits that are electrically connected via a semiconductor switch between respectively the DC positive and negative electrodes and the vehicle body earth. The master battery control device 100, along with controlling the semiconductor switch and electrically connecting the resistance voltage divider circuits between respectively the DC positive and negative electrodes and the vehicle body earth, also reads in voltage information obtained by the resistance voltage divider circuits due to this connection, and decides upon the presence or absence of leakage between the battery module portion and the vehicle body earth. If a leak is present, then the master battery control device 100 notifies this fact to the higher ranking control device, and also issues a warning to the drive by illuminating a warning lamp near the driving seat, or via audio. By doing this, it is possible to allow the vehicle to be driven in a safe manner in a state in which the necessary safety measures are being implemented, and also it is possible to invite the driver to perform the appropriate inspection and/or repairs promptly at a service center.

Furthermore, the master battery control device 100 detects the overall voltage and current of the battery module portion, on the basis of the output signal of a current sensor 120 that is electrically connected in series to the positive side of the battery module portion, and on the basis of the output signal of a voltage sensor 130 that is electrically connected in parallel between the positive and negative electrodes of the battery module portion.

As previously described, a signal outputted from an ignition key switch is inputted to the master battery control device 100. This signal outputted from the ignition key switch cues starting and stopping of the battery storage system 1000.

When the ignition key switch is turned to ON, in the master battery control device 100, the power supply circuit operates on the basis of the output signal from the ignition key switch, and drive voltage is supplied from the power supply circuit to the plurality of electronic circuit components. Due to this, the plurality of electronic circuit components operate, and the master battery control device 100 starts. When the master battery control device 100 starts, start signals are outputted in parallel from the master battery control device 100 to each of the local battery control devices 220, 320, 420, and 520. And, in each of the local battery control devices 220, 320, 420, and 520, a power supply circuit operates on the basis of this start signal, so that drive voltage is supplied from this power supply circuit to a plurality of electronic circuit components. Due to this these pluralities of electronic circuit components operate, so that each of the local battery control devices 220, 320, 420, and 520 starts.

When each of the local battery control devices 220, 320, 420, and 520 starts, a start signal is outputted from this local battery control device 220, 320, 420, and 520 to the corresponding cell control device 230, 330, 430, and 530. In these cell control devices 230, 330, 430, and 530, power supply circuits of a plurality of integrated circuits operate sequentially on the basis of these start commands. Due to this, the pluralities of integrated circuits start, and the cell control devices 230, 330, 430, and 530 start. After the cell control devices 230, 330, 430, and 530 have started, predetermined initial processing is executed by each of the battery module sets 200, 300, 400, and 500, and thereby the starting of the battery storage system 100 is completed. And completion report is outputted from the master battery control device 100 to the higher ranking control device.

As this predetermined initial processing, for example, there may be performed measurement of the voltages of the lithium battery cells, anomaly diagnostics, measurement of the overall voltages or currents of the assembled battery modules 210, 310, 410, and 510, measurement of their temperatures, calculation of the states of charge and/or the states of health of the assembled battery modules 210, 310, 410, and 510, and so on.

When the ignition key switch is turned to OFF, stop signals are outputted in parallel from the master battery control device 100 to each of the local battery control devices 220, 320, 420, and 520. And, when each of the local battery control devices 220, 320, 420, and 520 receives its stop signal, it outputs a stop signal to the corresponding cell control device 230, 330, 430, and 530. Due to this, predetermined ending processing is executed by each of the battery module sets 200, 300, 400, and 500. When this predetermined ending processing terminates, first, the power supply circuit for the integrated circuits of each of the cell control devices 230, 330, 430, and 530 goes to OFF. Due to this, the cell control devices 230, 330, 430, and 530 stop their operation. When these cell control devices 230, 330, 430, and 530 stop their operation and communication between the cell control devices 230, 330, 430, and 530 ceases to be possible, then the operation of the power supply circuits of the local battery control devices 220, 320, 420, and 520 stops, and the operations of their pluralities of electronic circuit components stop. Due to this, the operation of each of the local battery control devices 220, 320, 420, and 520 stops. When these local battery control devices 220, 320, 420, and 520 stop their operation, and communication between the local battery control devices 220, 320, 420, and 520 ceases to be possible, then the operation of the power supply circuit of the master battery control device 100 stops, and the operations of its plurality of electronic circuit components stop. Due to this, the master battery control device 100 stops, and the battery storage system 1000 stops.

As this predetermined ending processing, for example, measurement of the voltage of each of the lithium battery cells, regulation of the state of charge of each of the lithium battery cells, and so on may be cited.

Information transmission between the master battery control device 100 and the higher ranking control device such as the motor control device 11 or the like, and information transmission between the master battery control device and the various local battery control devices 220, 320, 420, and 520, utilize communication via an onboard local area network. LIN (Local Interconnect Network) communication is used for information transmission between the local battery control devices 220, 320, 420, and 520 and the corresponding cell control devices 230, 330, 430, and 530.

Electrical continuity or discontinuity of the first and second positive side main contactors 800 and 801 and of the first and second negative side main contactors 810 and 811 is controlled by the master battery control device 100, upon receipt of a command signal outputted from the motor control device 11. When the onboard electrical system starts, by receiving a notification of completion of starting of the battery storage system 100 from the master battery control device 100, the motor control device 11 outputs a command signal for continuity of the first and second positive side main contactors 800 and 801 and of the first and second negative side main contactors 810 and 811 to the master battery control device 100. And, on the basis of this command signal, the master battery control device 100 outputs drive signals to the operating power supplies of the first and second positive side main contactors 800 and 801 and of the first and second negative side main contactors 810 and 811, and thus performs control so that the first and second positive side main contactors 800 and 801 and the first and second negative side main contactors 810 and 811 become continuous. Moreover, upon receipt of an OFF output signal from the ignition key switch when the onboard electrical system is to be stopped, or upon receipt of an anomaly signal when an anomaly has taken place in the onboard electrical system, the motor control device 11 outputs a command signal for discontinuity of the first and second positive side main contactors 800 and 801 and of the first and second negative side main contactors 810 and 811 to the master battery control device 100. And, on the basis of this command signal, the master battery control device 100 outputs drive signals to the operating power supplies of the first and second positive side main contactors 800 and 801 and of the first and second negative side main contactors 810 and 811, and thus performs control so that the first and second positive side main contactors 800 and 801 and the first and second negative side main contactors 810 and 811 become discontinuous.

When the onboard electrical system is to be started, first, the first and second negative side main contactors 810 and 811 are turned ON. Next, the positive side main contactors 800 and 801 are turned on. Due to this, main current is supplied to the power module 14 from the battery module portion, via the positive side main contactors 800 and 801.

In the following, the information handled by the master battery control device 100, the local battery control device 220, 320, 420, and 520, and the cell control devices 230, 330, 430, and 530 is summarized.

The cell control devices 230, 330, 430, and 530 detect the voltages of the various lithium battery cells, and transmit information specifying these voltages that have been detected to the corresponding local battery control devices 220, 320, 420, and 520. Furthermore, when an anomaly has occurred in the internal circuitry of one of the lithium battery cells, or in their own circuitry, the cell control devices 230, 330, 430, and 530 transmit an anomaly flag and information specifying the details of the anomaly to the corresponding one of the local battery control devices 220, 320, 420, and 520.

The local battery control devices 220, 320, 420, and 520 take as input information the information specifying the voltages of the lithium battery cells transmitted from the corresponding cell control devices 230, 330, 430 and 530, the detected voltage values transmitted from the voltage sensors 260, 360, 460, and 560, the detected current values transmitted from the current sensors 250, 350, 450, and 550, and the detected temperature values transmitted from the plurality of temperature sensors 270, 370, 470, and 570 (that may, for example, be thermistors) provided internally to the assembled battery modules 210, 310, 410, and 510, and, on the basis of that input information and initial information relating to the lithium battery cells that has been stored in advance, calculate or determine the states of charge (SOC), the states of health (SOH), the permitted charge and discharge currents, the total voltages, the charge or discharge currents, the maximum and minimum values of temperature, and the maximum and minimum values of cell voltage of the corresponding assembled battery modules 210, 310, 410, and 510, and transfer information specifying those values to the master battery control device 100.

The master battery control device 100 takes as input information these states of charge (SOC), states of health (SOH), permitted charge and discharge currents, total voltages, charge or discharge currents, maximum and minimum values of temperature, and maximum and minimum values of cell voltage of the corresponding assembled battery modules 210, 310, 410, and 510, transmitted as information from the local battery control devices 220, 320, 420, and 520, and, on the basis of this input information, calculates the state of charge (SOC) of the battery module portion, its charge and discharge current rates or its allowable charge and discharge power or its allowable charge or discharge current, its temperatures, its lithium battery cell voltages, and its states of health (SOH), and transmits information specifying these values to the higher ranking control device.

Here, the state of charge (SOC) of the battery module portion is the average value of the states of charge (SOC) of the assembled battery modules 210, 310, 410, and 510, transmitted as information from the local battery control devices 220, 320, 420, and 520. The charge and discharge current rates or the allowable charge and discharge power or the allowable charge or discharge current is calculated on the basis of information specifying the allowable charge and discharge current, the maximum and minimum values of cell voltage, the calculated state of charge (SOC) of the battery module portion, and so on, transmitted as information from the local battery control devices 220, 320, 420, and 520. The temperatures of the battery module portion are the maximum value and the minimum value of the temperatures of the assembled battery modules 210, 310, 410, and 510, transmitted as information from the local battery control devices 220, 320, 420, and 520. The cell voltages of the battery module portion are the maximum value and the minimum value among the cell voltages of the assembled battery modules 210, 310, 410, and 510, transmitted as information from the local battery control devices 220, 320, 420, and 520. And the states of health (SOC) of the battery module portion are the maximum value and the minimum value among the states of health (SOC) of the assembled battery modules 210, 310, 410, and 510, transmitted as information from the local battery control devices 220, 320, 420, and 520.

Furthermore, if an anomaly has taken place with any one of the sensors of the battery module sets 300 through 500, the master battery control device 100 does not immediately stop the operation of the battery storage system 1000, but rather substitutes, as information from the sensors of this anomalous battery module set, information from the sensors of some other healthy battery module set that has an electrical correlation relationship with this anomalous battery module set, and continues the control described above, so that the function of the battery storage system 1000 as a power supply is not immediately lost. The details of this control method will be explained hereinafter, subsequent to description of the hardware structure of the battery storage system 1000.

<Structure of the Battery Module Set Control Device>

Figure 3:
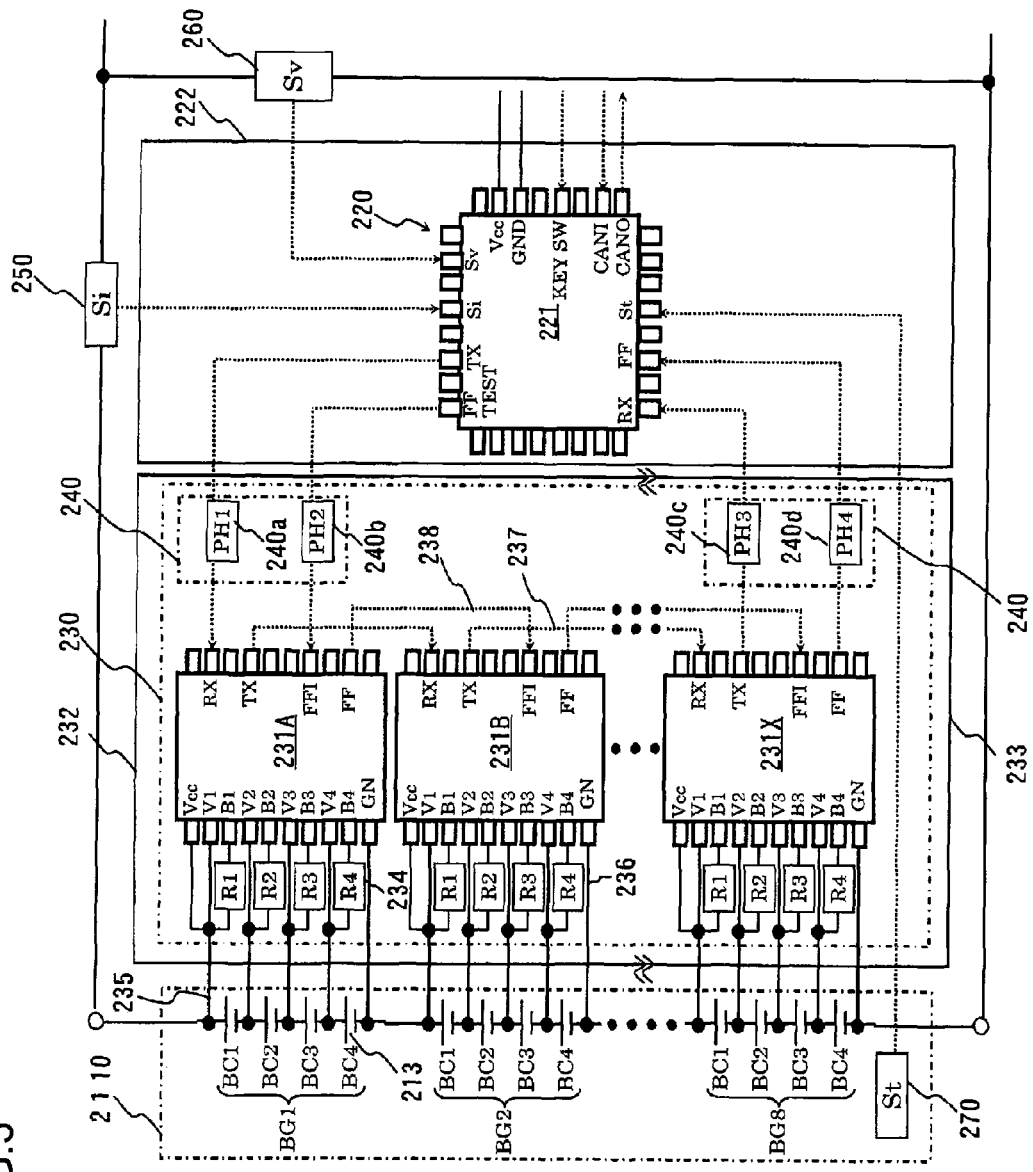
FIG. 3 is a circuit diagram showing the electrical connection structure of a control device for a set of battery modules in FIG. 2.
Figure 4:
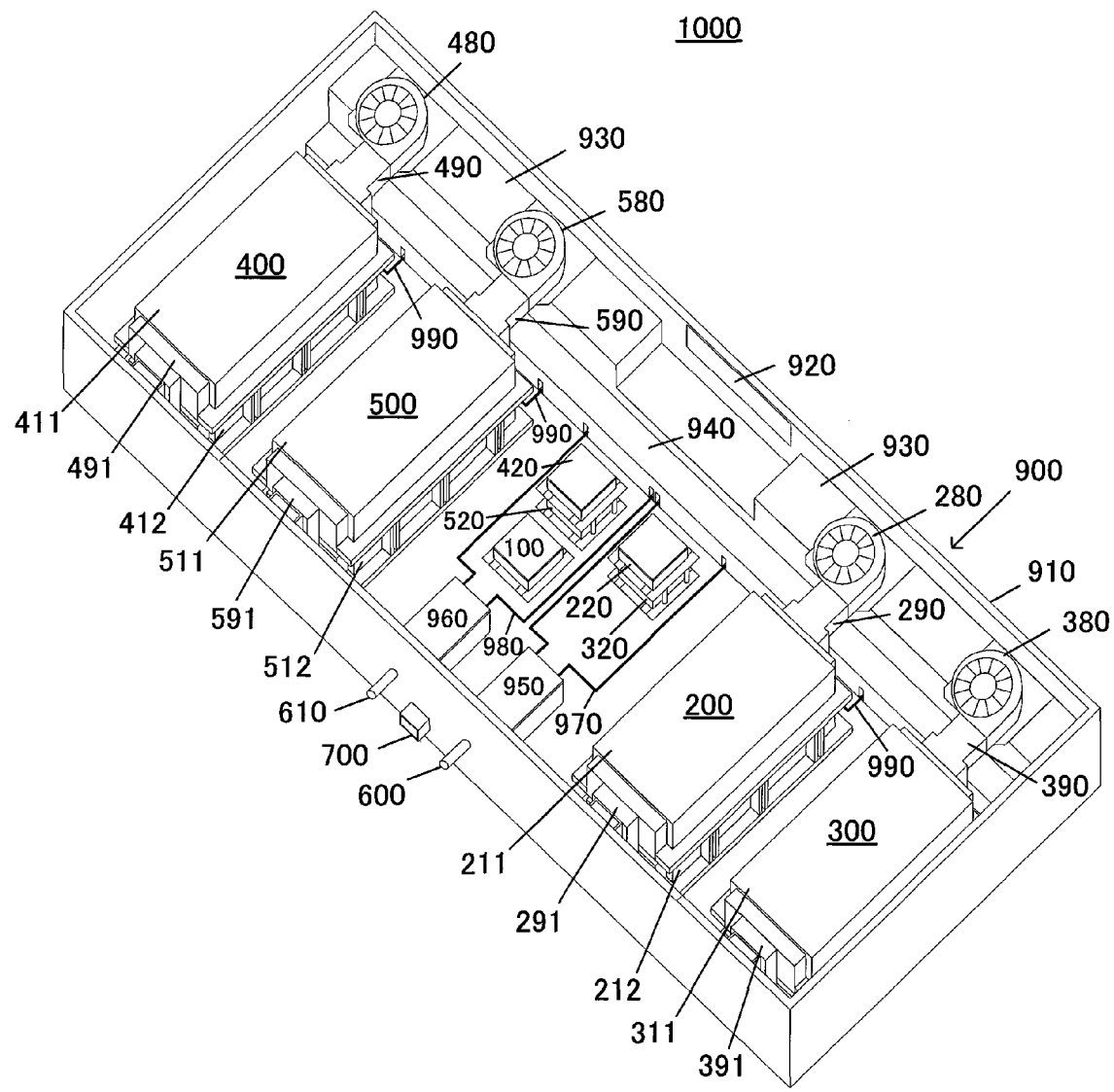
FIG. 4 is a perspective view showing the overall structure of an actual battery storage system that is mounted as the drive power supply of FIG. 1.

Next, the battery module set control device will be explained with reference to FIG. 3.

In this battery module set control device, the local battery control device 220 includes a plurality of electronic circuit components that include a microcomputer 221. These electronic circuit components are mounted upon a circuit substrate, and are housed in a chassis that is separate from that of the corresponding assembled battery module 210. The chassis in which this local battery control device 220 is housed is disposed in the neighborhood of the corresponding assembled battery module 210, as an electronic circuit for controlling that module 210.

The cell control device 230 includes a plurality of electronic components, and these include 24 integrated circuits (ICs) 23A through 231X, electrically connected to the lithium battery cells 213. These electronic circuit components are mounted upon circuit substrates 232 and 233, that are divided so as to correspond to the high potential side assembled battery block 211 and the low potential side assembled battery block 212. These circuit substrates 232 and 233 are housed in chassis of the corresponding high potential side assembled battery block 211 and the low potential side assembled battery block 212, and are disposed at end portions of these chassis at the one ends thereof in the longitudinal direction.

Furthermore, the cell control device 230 includes a plurality of circuit elements such as a plurality of resistors 234 and a plurality of photo-couplers 240 and so on. The resistors 234 are current dissipation elements that are used when regulating the amounts of charge in the lithium battery cells 213, and that dissipates currents flowing out of the lithium battery cells 213 by converting them into heat, and four of these resistors (R1 through R4) are provided for each of the integrated circuits 231A through 231X. And the photo-couplers 240 are interface circuit elements that are provided upon the signal transmission path between the microcomputer 221 and the integrated circuit 231A, that is the first one of the integrated circuits 231A through 231X, and upon the signal transmission path between the microcomputer 221 and the integrated circuit 231X, that is the last one of the integrated circuits 231A through 231X, thus being insulation elements that optically transmit and receive signals at different electrical potential levels between these integrated circuits 231A and 231X, and the microcomputer 221.

The plurality of lithium battery cells 213 are divided into a plurality of groups that correspond to the integrated circuits 231A through 231X. In this embodiment, the 96 lithium battery cells 213 that correspond to the 48 lithium battery cells 213 constituting the battery group for the high potential side assembled battery block 211 and the 48 lithium battery cells 213 constituting the battery group for the low potential side assembled battery block 212 are allotted between 24 groups. In concrete terms, the 96 lithium battery cells 213 that are electrically connected in series are divided up four at a time, according to the order in which they are connected, in order from those at higher level of electrical potential, so as to constitute 24 groups. In other words, the 96 lithium cells 213 are divided up into groups so that: the group of lithium battery cells that are electrically connected in series from the 1st lithium battery cell 213 in order of electrical potential through the 4th lithium battery cell 213 in order of electrical potential constitute a first group; the group of lithium battery cells that are electrically connected in series from the 5th lithium battery cell 213 in order of electrical potential through the 8th lithium battery cell 213 in order of electrical potential constitute a second group; . . . the group of lithium battery cells that are electrically connected in series from the 89th lithium battery cell 213 in order of electrical potential through the 92nd lithium battery cell 213 in order of electrical potential constitute a twenty-third group; and the group of lithium battery cells that are electrically connected in series from the 93rd lithium battery cell 213 in order of electrical potential through the 96th lithium battery cell 213 in order of electrical potential constitute a twenty-fourth group.

It should be understood that while, in this embodiment, as an example, a case is cited and explained in which the plurality of lithium battery cells 213 are divided up into twelve groups for each of the two battery blocks, as an alternative method of dividing into groups, it would also be acceptable to divide up the 96 lithium battery cells 213 six at a time, into sixteen groups.

The positive sides and the negative sides of each of the four lithium battery cells 213 (BC1 through BC4) that constitute the first group are electrically connected via connection lines 235 and substrate wiring 236 to the integrated circuit 231A. Due to this, analog signals are read in to the integrated circuit 231A via the connection lines 235 and the substrate wiring 236, based upon the respective terminal voltages of these four lithium battery cells 213 that constitute the first group. The integrated circuit 213A includes an analog-digital converter, and these analog signal that are read in are sequentially converted to digital signals, so that the terminal voltages of the four lithium battery cells 213 that constitute the first group are detected. And, in a similar manner to the case of the integrated circuit 231A, the other integrated circuits 231B through 231X are electrically connected via the connection lines 235 and the substrate wiring 236, to the positive sides and the negative sides of each of the four ones of the lithium battery cells 213 that constitute the corresponding groups, so that each of the circuits reads in and detects the terminal voltages of those four lithium battery cells 213 that constitute the corresponding group.

Via the connection lines 235 and the substrate wining 236, bypass series circuits, in which resistors 234 (R1 through R4) and semiconductor switching elements provided internally to the integrated circuit 231A are connected in series, are electrically connected in parallel between the positive sides and the negative sides (i.e. between the terminals) of each of the four lithium cells 213 that constitute the first group. For the other groups as well, in a similar manner to the case with the first group, bypass series circuits are electrically connected in parallel between the positive sides and the negative sides of the four lithium cells 213 that constitute those groups.

On the basis of a state of charge regulation command outputted from the local battery control device 220, the integrated circuit 231A makes its semiconductor switching elements separately continuous for predetermined time periods, so that the bypass series circuits are separately electrically connected in parallel between the positive sides and the negative sides of the four lithium battery cells 231 that constitute the first group. Due to this, the lithium battery cells 213 to which the bypass series circuits are electrically connected in parallel are electrically discharged, so that their states of charge (SOC) are regulated. And, in a similar manner to the case with the first integrated circuit 231A, the other integrated circuits 231B through 231X as well control the semiconductor switching elements of their bypass series circuits that are connected in parallel with the sets of four ones of the lithium battery cells 213 that constitute the corresponding groups separately to be continuous for predetermined time periods, so that the states of charge SOC of those sets of lithium battery cells 213 that constitute those corresponding groups are individually regulated.

As described above, by individually controlling the continuity of the semiconductor switching elements of the bypass series circuits that are electrically connected in parallel with the sets of four lithium battery cells constituting the corresponding groups with the integrated circuits 231A through 231X, and by thus regulating the states of charge SOC of the four lithium battery cells 213 that constitute each group individually, it is possible to make the states of charge SOC of the lithium battery cells 213 in the entire group uniform, so that it is possible to prevent excess charging of the lithium battery cells 213 and the like.

The integrated circuits 231A through 231X detect any anomalous states of the sets of four lithium battery cells 213 that constitute the corresponding groups. An anomalous state can be excess charge or excess discharge. Excess charge and excess discharge are detected by the integrated circuits 231A through 231X comparing together the detected value of the terminal voltages of the four lithium battery cells 213 that make up the corresponding group, and both of an excess charge threshold value and an excess discharge threshold value. Excess charge is determined upon when the detected value of the terminal voltage exceeds the excess charge threshold value, while excess discharge is determined upon when the detected value of the terminal voltage is lower than the excess discharge threshold value. Furthermore, the integrated circuits 231A through 231X perform self-diagnosis for anomalies of their own internal circuitry, for example anomaly of a semiconductor switching element that is used for regulating the state of charge, temperature anomaly, and the like.

In this way, by means of the same internal circuitry, it is arranged for all the integrated circuits 231A through 231X to have the same functions of detecting the terminal voltages of the four lithium battery cells 213 (BC1 through BC4) that make up the corresponding group, regulating their states of charge, detection of anomalous states, and performing anomaly diagnostics for their own internal circuitry.

On one side of each of the integrated circuits 231A through 231X, there are provided a plurality of terminals that are electrically connected to the side of the assembled battery module 210. This plurality of terminals includes a power supply terminal (Vcc), voltage terminals (V1 through V4 and GND), and bypass terminals (B1 through B4). Substrate wiring 236, that is electrically connected to the connection lines 235, is electrically connected to the voltage terminals (V1 through V4 and GND). The semiconductor switching element ends of resistors 234 are electrically connected to the bypass terminals (B1 through B4) via the substrate wiring 236. And the opposite ends of the resistors 234 to their semiconductor switching element ends are electrically connected via the substrate wiring 236 to the voltage terminals (V1 through V4). And the power supply terminal (Vcc) is electrically connected via the substrate wiring 236 to the voltage terminal V1 (i.e. to the voltage terminal that is electrically connected to the positive side of the lithium battery cell BC1 at the highest potential end).

The voltage terminals (V1 through V4 and GND) and the bypass terminals (B1 through B4) are arranged alternatingly according to the order of electrical potential of the lithium battery cells 213 to which they are electrically connected. Due to this, it is possible to build this circuit in which the integrated circuits 231A through 231X are electrically connected to the connection lines 235, in a simple manner.

The voltage terminal GND is electrically connected to the negative side of the lithium battery cell BC4 at the lowest voltage end, i.e. to the negative side of the one of the four lithium battery cells 213 making up the corresponding group that is at the lowest electrical potential. Due to this, each of the integrated circuits 231A through 231X is able to operate by taking the minimum electrical potential of its corresponding group as a reference electrical potential. Since, in this manner, the reference electrical potentials of the integrated circuits 231A through 231X are different, therefore it is possible to reduce the voltage differences that are applied to each of the integrated circuits 231A through 231X from the assembled battery module 210, and accordingly it is possible to make the withstand voltages of the integrated circuits 231A through 231X smaller, so that it is possible to enhance the security and the reliability yet further.

The power supply terminal Vcc is electrically connected to the positive side of the lithium battery cell BC1, that is the one of the four lithium battery cells 213 making up the corresponding group that is at the highest electrical potential. Due to this, each of the integrated circuits 231A through 231X generates a voltage (for example 5V) for operating its internal circuitry, from the highest level voltage of its corresponding group. Since, in this manner, the operating voltages of the internal circuitry of the integrated circuits 231A through 231X are generated from the highest voltages of the corresponding groups, accordingly it is possible to equalize the power consumed from the four lithium battery cells 213 that make up the corresponding groups, so that it is possible to prevent imbalance of the states of charge SOC of the four lithium battery cells 213 that make up the corresponding groups.

A plurality of communication type terminals are provided at the opposite end of each of the integrated circuits 231A through 231X (i.e. at their opposite ends to those at which the voltage type terminals are provided). This plurality of terminals includes communication command signal transmit and receive terminals (TX and RX) for transmitting and receiving communication command signals, and anomaly signal transmit and receive terminals (FFO and FFI) for transmitting and receiving anomaly signals and anomaly test signals.

The communication command signal transmit and receive terminals (TX and RX) of the integrated circuits 231A through 231X are electrically connected in series in a non-insulated state in order of electrical potential of the corresponding groups. In other words, the communication command signal transmit terminals of these integrated circuits 231A through 231X are electrically connected to the communication command signal receive terminals in the following manner: the communication command signal transmit terminal (TX) of the integrated circuit 231A (i.e. of that integrated circuit at the highest electrical potential) is electrically connected in series in a non-insulated state to the communication command signal receive terminal (RX) of the integrated circuit 231B (i.e. of the integrated circuit at the next lower electrical potential); the communication command signal transmit terminal (TX) of this integrated circuit 231B is electrically connected in series in a non-insulated state to the communication command signal receive terminal (RX) of the integrated circuit 231C; . . . the communication command signal transmit terminal (TX) of this integrated circuit 231W is electrically connected in series in a non-insulated state to the communication command signal receive terminal (RX) of the integrated circuit 231X. The type of connection method employed in this embodiment is termed the "daisy-chain" connection method.

The anomaly signal transmit and receive terminals (FFO, FFI) of the integrated circuits 231A through 231X have a similar connection relationship, and are electrically connected in series in a non-insulated state according to the order of the electrical potential of the corresponding groups. In other words, the anomaly signal transmit terminal (FFO) of an integrated circuit at a certain electrical potential level is electrically connected in series in a non-insulated state to the anomaly signal receive terminal (FFI) of the integrated circuit that is at the next lower potential level down from that integrated circuit at that certain electrical potential level.

The light reception side of a photo-coupler 240a (PH1) is electrically connected to the communication command signal receive terminal (RX) of the integrated circuit 231A corresponding to the group of a plurality of lithium battery cells 213 that is at the highest electrical potential. And the communication command signal transmit terminal (TX) of the microcomputer 221 is electrically connected to the light emission side of this photocoupler 240a. Moreover, the light emission side of a photo-coupler 240c (PH3) is electrically connected to the communication command signal transmit terminal (TX) of the integrated circuit 231X corresponding to the group of a plurality of lithium battery cells 213 that is at the lowest electrical potential. And the communication command signal receive terminal (RX) of the microcomputer 221 is electrically connected to the light reception side of this photo-coupler 240c. Due to these connections, along with electrical insulation being provided between the cell control device 230 and the local battery control device 220, a communication command signal loop transmission path 237 is formed from the microcomputer 221 to the photo-coupler 240*a*, then to the integrated circuit 231A, . . . then to the integrated circuit 231X, then to the photo-coupler 240*c* back to the microcomputer 221, in that order. This loop transmission path 237 is a serial transmission path.

The communication command signals outputted from the microcomputer 221 are transmitted to this communication command signal loop transmission path 237. A communication command signal is a signal consisting of a plurality of bytes, in which are provided a plurality of regions such as data regions specifying the details of this communication (i.e. of this control) and so on, and these communication command signals are transmitted in a loop manner according to the above described order of transmission.

These communication command signals that are outputted from the microcomputer 221 to the integrated circuits 231A through 231X via the communication command signal loop transmission path 237 include: request signals for requesting the detected terminal voltages of the lithium battery cells 213; command signals for regulating the state of charge of the lithium battery cells 213; start signals for bringing the integrated circuits 231A through 231X from the sleep state to the wake-up state, in other words for starting the operation of these circuits; stop signals for putting the integrated circuits 231A through 231X into the sleep state from the wake-up state, in other words for stopping the operation of these circuits; address setting signals for setting addresses for communication by the integrated circuits 231A through 231X; anomaly checking signals for checking anomalous states of the integrated circuits 231A through 231X; and so on.

It should be understood that while, in this embodiment, a case has been cited and described in which the communication command signals are transmitted from the integrated circuit 231A along to the integrated circuit 231X, it would also be acceptable for them to be transmitted from the integrated circuit 231X along to the integrated circuit 231A.

Furthermore, the light reception side of a photo-coupler 240*b* (PH2) is electrically connected to the anomaly signal receive terminal (FFI) of the integrated circuit 231A corresponding to the group of a plurality of lithium battery cells 213 that is at the highest electrical potential. And an anomaly test signal transmit terminal (FFTEST) of the microcomputer 221 is electrically connected to the light emission side of this photocoupler 240*b*. Moreover, the light emission side of a photo-coupler 240*d* (PH4) is electrically connected to the anomaly signal transmit terminal (FFO) of the integrated circuit 231X corresponding to the group of a plurality of lithium battery cells 213 that is at the lowest electrical potential. And the anomaly signal receive terminal (FF) of the microcomputer 221 is electrically connected to the light reception side of this photo-coupler 240*d*. Due to these connections, along with electrical insulation being provided between the cell control device 230 and the local battery control device 220, an anomaly signal loop transmission path 238 is formed from the microcomputer 221 to the photo-coupler 240*b*, then to the integrated circuit 231A, . . . then to the integrated circuit 231X, then to the photo-coupler 240*d* back to the microcomputer 221, in that order. This loop transmission path 238 is a serial transmission path.

The anomaly test signals outputted from the microcomputer 221 are transmitted to this anomaly signal loop transmission path 238. An anomaly test signal is a one bit Hi level signal that is transmitted for detecting an anomaly in the integrated circuits 231A through 231X or an anomaly such as an interruption in the communication circuitry or the like, and these anomaly test signals are transmitted in a loop manner according to the above described order of transmission. If there is an anomaly, then the anomaly test signal is returned to the microcomputer 221 as a Low level signal. Due to this, the microcomputer 221 is able to detect that there is an anomaly in the integrated circuits 231A through 231X, or an anomaly such as an interruption in the communication circuitry or the like. Moreover, if an anomaly has been detected by any one of the integrated circuits 231A through 231X, then a signal that indicates the anomaly is outputted to the anomaly signal loop transmission path 238 from the integrated circuit that has detected the anomaly, for example the integrated circuit 231C. The signal that indicates the anomaly is a 1-bit signal, and is transmitted from the integrated circuit in which the anomaly has occurred (supposed to be 231C) to the microcomputer 221 in the following order: integrated circuit 231D, . . . , integrated circuit 231X, and photo-coupler 240*d*. Due to this, it is possible for a notification to be rapidly issued from the integrated circuit in which the anomaly has been detected to the microcomputer 221.

It should be understood that while, in this embodiment, a case has been cited and described in which the anomaly test signals are transmitted from the integrated circuit 231A along to the integrated circuit 231X, it would also be acceptable to arrange for them to be transmitted from the integrated circuit 231X along to the integrated circuit 231A. Moreover while, in this embodiment, a case has been cited and described in which the signal that describes the anomaly is transmitted from the integrated circuit that has detected the anomaly towards an integrated circuit that is at a lower level of electrical potential, it would also be acceptable to arrange for this signal to be transmitted from the integrated circuit that has detected the anomaly towards an integrated circuit that is at a higher level of electrical potential.

The photo-couplers 240*a* through 240*d* (PH1 through PH4) not only provide electrical insulation of the communication command signal loop transmission path 237 and the anomaly signal loop transmission path 238 between the cell control device 230 and the local battery control device 220, but also convert the signals transmitted and received between the cell control device 230 and the local battery control device 220, during their transmission, to optical signals. As described above, the respective power supply electrical potentials and the respective power supply voltages of the cell control device 230 and the local battery control device 220 are quite different. Due to this, if the cell control device 230 and the local battery control device 220 were to be electrically connected together and signal transmission were implemented between them directly, then it would become necessary to perform potential conversion and voltage conversion upon the transmitted signals, and this would increase the amount of interface circuitry between the cell control device 230 and the local battery control device 220 and also raise its price, so that it would become impossible to provide a compact control device at a cheap price. Thus, in this embodiment communication between the cell control device 230 and the local battery control device 220 is implemented using the photo-couplers 240*a* through 240*d* (PH1 through PH4), and thereby it becomes possible to make the control device more compact and to reduce its cost.

Furthermore, as previously described, the power supply electrical potentials also differ between the various integrated circuits 231A through 231X. However since, in this embodiment, the integrated circuits 231A through 231X are electrically connected in series according to the order of electrical potential of the corresponding groups of pluralities of the lithium battery cells 213, in other words since they are connected in a daisy chain manner, accordingly it is possible to implement signal transmission between the various integrated circuits 231A through 231X in a simple manner by electrical potential conversion (level shifting). On its signal reception side, each of the integrated circuits 231A through 231X includes an electrical potential conversion (level shifting) circuit. Thus since, in this embodiment, the signal transmission between the various integrated circuits 231A through 231X is implemented in this simple manner, rather by providing photo-couplers whose price is higher than that of other circuit elements, accordingly it is possible to provide a control device that is compact and moreover low in price.

The microcomputer 221 inputs signals of various types, and, along with transmitting the communication command signals previously described to the cell control device 230 on the basis of the input information obtained from these input signals, or on the basis of calculated information that has been calculated from this input information, also outputs signals to the higher ranking control device (the motor control device 11 or the vehicle control device).

The various types of signal that are inputted to the microcomputer 221 include: terminal voltage signals of the lithium battery cells 213 outputted from the integrated circuits 231A through 231X; an anomaly signal outputted from any one of the integrated circuits 231A through 231X that has detected an anomaly; a current sensor signal outputted from the current sensor 250 for detecting the charge/discharge current of the assembled battery module 210; a voltage sensor signal outputted from the voltage sensor 260 for detecting the total voltage of the assembled battery module 210, temperature sensor signals outputted from the temperature sensors (such as thermistor elements) 270, provided internally to the assembled battery module 210 for detecting the temperatures of the battery groups; an ON/OFF signal based upon the operation of the ignition key switch; signals outputted from a higher ranking control device (the motor control device 11 or the vehicle control device); and so on.

And the various types of signal that are outputted from the microcomputer 221 include: the previously described communication command signals; signals that provide information calculated on the basis of the state information of the assembled battery module 210 (such as, for example, its voltage, current, temperature, and so on) like, for example, the amount of power that can be charged into the assembled battery module 210 or discharged from it, its state of charge SOC, its state of health SOH, and so on; and signals that provide anomalous state information (such as excess charge, excess discharge, excess temperature, or the like) as determined from results or anomaly information calculated on the basis of the state information of the assembled battery module 210 (for example its voltage, current, temperature, and so on) and the like.

Among those output signals, the signals that provide information such as the amount of power that can be charged or discharged, the state of charge SOC, and the state of health SOH and so on, and the signals that provide anomalous state information (for example, excess charge, excess discharge, excess temperature and so on) are outputted to the higher ranking control device (the motor control device 11 or the vehicle control device).

<Hardware Structure of the Battery Storage System 1000>

Next, the actual construction of the battery storage system 1000 will be explained with reference to FIGS. 4 through 8.

The battery storage system 1000 includes the four battery module sets 200, 300, 400, and 500, that are shaped as rectangular parallelepipeds and are contained in a casing 900, consisting of a lower casing member 910 and an upper lid (not shown in the figures). The casing 900 (the lower casing member 910) is a storage unit shaped as a rectangular parallelepiped. The battery module sets 200, 300, 400, and 500 are lined up in one row along the longitudinal direction of the casing 900, so that their longitudinal directions coincide with the direction transverse to the casing 900, and so that a certain open space is defined between them at the central portion of the casing 900 in the longitudinal direction. The battery module sets that are disposed at one side of this space at the central portion of the casing 900 in the longitudinal direction, are the battery module sets 200 and 300 that are included in the first battery module block (with the battery module set 200 positioned towards the center of the casing 900). And the battery module sets that are disposed at the other side of this space at the central portion of the casing 900 in the longitudinal direction, are the battery module sets 400 and 500 that are included in the second battery module block (with the battery module set 500 positioned towards the center).

An intake duct 930 is provided along one upper longitudinal edge of the casing 900 (the lower casing member 910), for inducting air from the exterior into the casing 900 as a cooling medium for the battery module sets 200, 300, 400, and 500. At a central portion of the longitudinal side wall of the casing 900 (the lower casing member 910), at a spot that corresponds to the open space provided at the central portion of the casing 900 in its longitudinal direction, an intake aperture (not shown in the figures) is provided for inducting this cooling air from the exterior into the intake duct 930. And at a central portion of the longitudinal side wall of the casing 900 (the lower casing member 910) (i.e. at a location that corresponds to the open space provided at the central portion of the casing 900 in its longitudinal direction), and moreover above the abovementioned intake aperture, an exhaust aperture 920 is provided for expelling cooling air that has finished cooling the battery module sets 200, 300, 400, and 500 from the interior of the casing 900 (the lower casing member 910) to the exterior.

At the central portion of the casing 900 (the lower casing member 910) in its longitudinal direction, in the open space described above, there are disposed the master battery control device 100, the battery control devices 220, 320, 420, and 520 described below, a box 950 for the first and second positive side main contactors 800 and 801 and the first and second negative side main contactors 810 and 811 on the positive side, and a box 960 for the first and second positive side main contactors 800 and 801 and the first and second negative side main contactors 810 and 811 on the negative side. The battery control devices 220, 320, 420, and 520 described below are disposed in an overlapped arrangement at one end in the transverse direction of the center space in the casing 900 (the lower casing member 910). In concrete terms, the local battery control devices 220 and 320 are arranged towards the side of the battery module set 200 as an overlapped lower layer and upper layer, while the local battery control devices 420 and 520 are arranged towards the side of the battery module set 500 in a similar manner as an overlapped lower layer and upper layer. The box 950 for the first and second positive side main contactors 800 and 801 and the first and second negative side main contactors 810 and 811 on the positive side, and the box 960 for the first and second positive side main contactors 800 and 801 and the first and second negative side main contactors 810 and 811 on the negative side, are arranged side by side in the longitudinal direction of the casing 900 (the lower casing member 910), at the other end portion in the transverse direction of the casing 900 (the lower casing member 910). And the master battery control device 100 is disposed between the box 960 for the first and second positive side main contactors 800 and 801 and the first and second negative side main contactors 810 and 811 on the negative side, and the local battery control devices 420 and 520. In this manner, in this embodiment, along the transverse direction of the casing 900 (the lower casing member 910), in the center space of the casing 900 (the lower casing member 910), the various units are arranged so that the box 950 for the first and second positive side main contactors 800 and 801 and the first and second negative side main contactors 810 and 811 on the positive side, and the overlapped local battery control devices 220 and 320, form one row of units, while the box 960 for the first and second positive side main contactors 800 and 801 and the first and second negative side main contactors 810 and 811 on the negative side, the master battery control device 100, and the overlapped local battery control devices 420 and 520 form another row of units.

A wiring duct 940 is provided between the intake duct 930 and the battery module sets 200, 300, 400, and 500. A plurality of terminal portions are provided in the interior of this wiring duct 940. To these plural terminal portions, there are electrically connected: positive side high current cables 970 and negative side high current cables 980 that extend through the interior of the wiring duct 940 from the box 950 for the first and second positive side main contactors 800 and 801 and the first and second negative side main contactors 810 and 811 on the positive side, and from the box 960 for the first and second positive side main contactors 800 and 801 and the first and second negative side main contactors 810 and 811 on the negative side; and positive side and negative side connection cables 990 that extend through the interior of the wiring duct 940 from the assembled battery modules 210, 310, 410, and 510. The electric circuit shown in FIG. 2 is constituted in this manner.

In the box 950 for the first and second positive side main contactors 800 and 801 and the first and second negative side main contactors 810 and 811 on the positive side, the positive side high current cable 970 that is electrically connected to the positive side of the first battery module block (the one in which the battery module sets 200 and 300 are electrically connected in series) is electrically connected to the positive terminal 600 via the first positive side main contactor 800; and the positive side high current cable 970 that is electrically connected to the positive side of the second battery module block (the one in which the battery module sets 400 and 500 are electrically connected in series) is also electrically connected to the positive terminal 600 via the second positive side main contactor 801. Due to this, the positive sides of the first and second battery module blocks are electrically connected together in parallel.

And, in the box 960 for the first and second positive side main contactors 800 and 801 and the first and second negative side main contactors 810 and 811 on the negative side, the negative side high current cable 980 that is electrically connected to the negative side of the first battery module block (the one in which the battery module sets 200 and 300 are electrically connected in series) is electrically connected to the negative terminal 610 via the first negative side main contactor 810; and the negative side high current cable 980 that is electrically connected to the negative side of the second battery module block (the one in which the battery module sets 400 and 500 are electrically connected in series) is also electrically connected to the negative terminal 610 via the second negative side main contactor 811. Due to this, the negative sides of the first and second battery module blocks are electrically connected together in parallel.

The positive terminal 600 is provided upon the side wall of the casing 900 (the lower casing member 910), at the above described other end thereof in its transverse direction, at a spot that corresponds to the box 950 for the first and second positive side main contactors 800 and 801 and the first and second negative side main contactors 810 and 811 on the positive side, and extends towards the outward direction. And the negative terminal 610 is provided upon the side wall of the casing 900 (the lower casing member 910), at the above described other end thereof in its transverse direction, at a spot that corresponds to the box 960 for the first and second positive side main contactors 800 and 801 and the first and second negative side main contactors 810 and 811 on the negative side, and also extends towards the outward direction. The positive terminal 600 and the negative terminal 610 are arranged upon the casing 900 parallel to one another, and at the same height. A connector 700 for external communication is provided between the positive terminal 600 and the negative terminal 610. And the connector of a CAN communication cable is connected to this connector 700. Due to this, information can be transmitted between the master battery control device 100, and the motor control device 11 and the vehicle control device.

Taking the battery module set 200 as a representative, its assembled battery module 210 is made as an integrated structure in which two battery blocks, the high potential side assembled battery block 211 and the low potential side assembled battery block 212, are mounted one above the other. In this embodiment, the high potential side assembled battery block 211 is the upper one and the low potential side assembled battery block 212 is the lower one, but they might be the other way around without any problem.

Figure 5:
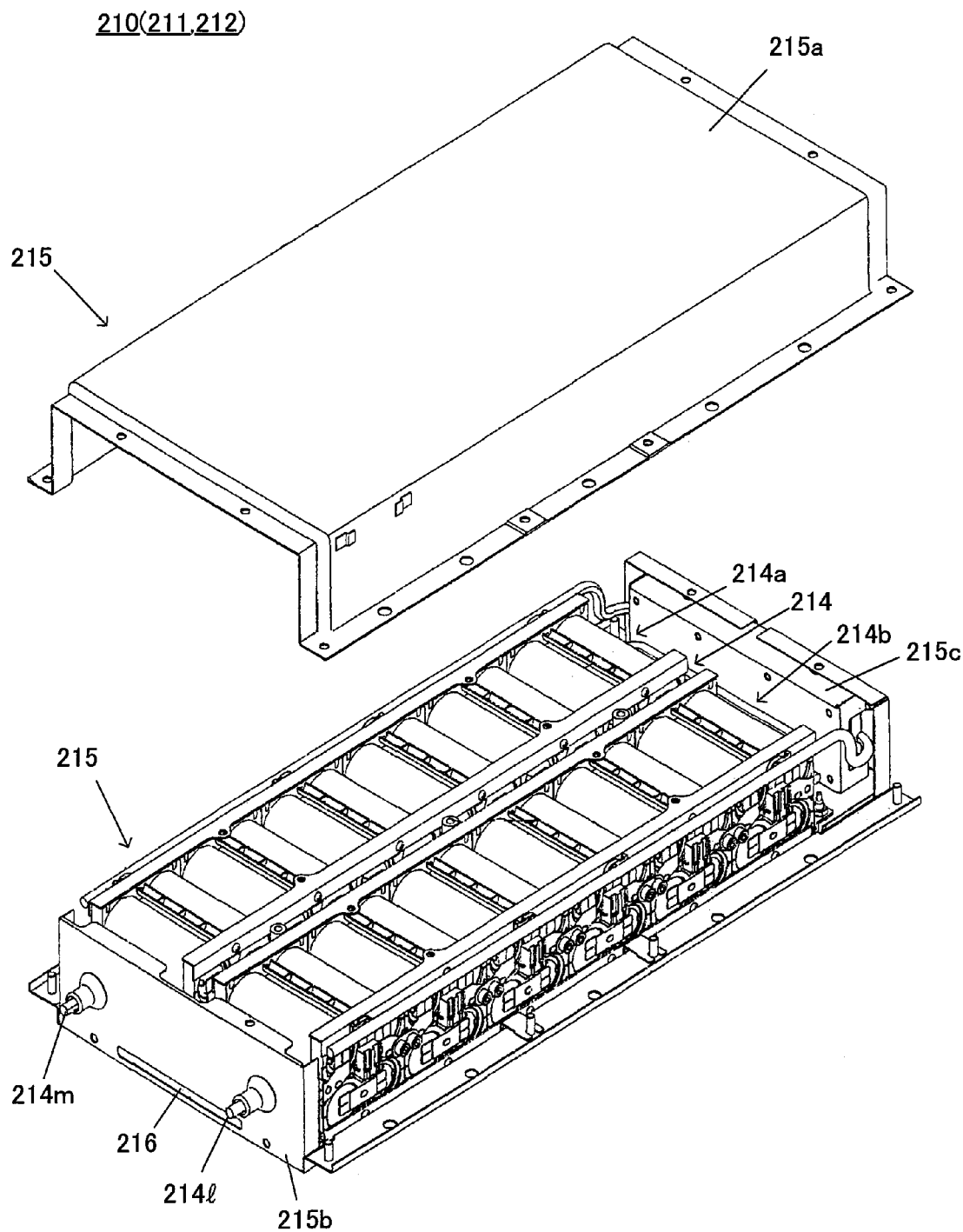
FIG. 5 is an exploded perspective view showing the internal structure of one assembled battery module included in the set of battery modules of FIG. 4.

Referring now to FIG. 5, the assembled battery block 211 is built with its battery group 214, in which 48 lithium battery cells 213 are electrically connected in series, being held within a module case 215 (a chassis that consists of a lower container 215b and an upper lid 215a). The module case 215 is a storage box having the shape of a rectangular parallelepiped.

A single intake side vent duct 290 (refer to FIG. 4) for both of the two assembled battery blocks 211 and 212 is attached to the battery module set 200 (in which the assembled battery modules 210 are stacked) at its one end portion in its longitudinal direction. A single fan unit 280 is connected to the upstream end portion of this intake side vent duct 290. And a single exhaust side vent duct 291 for both of the two-assembled battery blocks 211 and 212 is attached at the other end portion in the longitudinal direction of the battery module set 200 (in which the assembled battery modules 210 are stacked). While, in this embodiment, the single fan unit 280 (for intake) is provided to the battery module set 200, it would also be acceptable also to provide an exhaust side fan unit in the exhaust side vent duct 291. Moreover while, in this embodiment, a fan unit and fan ducts are provided to each of the battery module sets 200, 300, 400, and 510, it would also be acceptable to provide a fan unit and fan ducts to each of the assembled battery modules 210, 310, 410, and 510.

Figure 6:
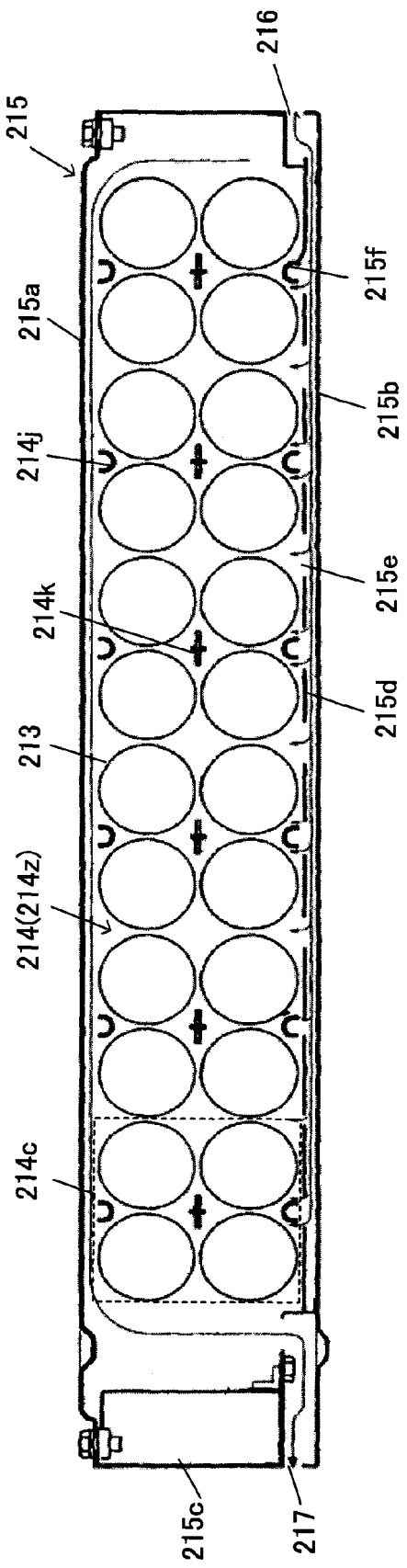
FIG. 6 is a sectional view showing the cross sectional structure of the assembled battery module of FIG. 5 in the transverse direction.

Referring now to FIG. 6, an air intake slot 216 is provided at the lower portion of the side wall of the module case at one end thereof in its longitudinal direction. And an exhaust aperture 217 (refer to FIG. 6) is provided at the lower portion of the side wall of the module case at the other end thereof in its longitudinal direction. A reinforcing louver 215d is provided between the bottom surface of the module case 215 (the lower container 215b) and the battery group 214. This reinforcement louver 215d is an element between the bottom surface of the module case 215 (the lower container 215b) and the battery group 214, for defining ducts for conducting cooling air inducted into the interior of the module case 215 in between the lithium battery cells 213 of the battery group 214, and this louver 214*d* is provided with through intake apertures 215*e* at positions that correspond to the lithium battery cells 213. The louver 215*d* is formed so that the areas of these intake apertures 215*e* become larger in progression from the air intake slot 216 towards the exhaust aperture 217, i.e. so that the aperture area of the intake aperture 215 closest to the exhaust aperture 217 is the largest. A shield louver member 215*f* is provided to the intake aperture 215*e* that is positioned closest to the air intake slot 216.

The battery group 214 is built from two assembled battery units (second sub-assembly units) 214*a* and 214*b*. Each of these two assembled battery units (second sub-assembly units) 214*a* and 214*b* is built from six assembled batteries (first sub-assembly units) 214*c* (refer to FIG. 7).

Figure 8:
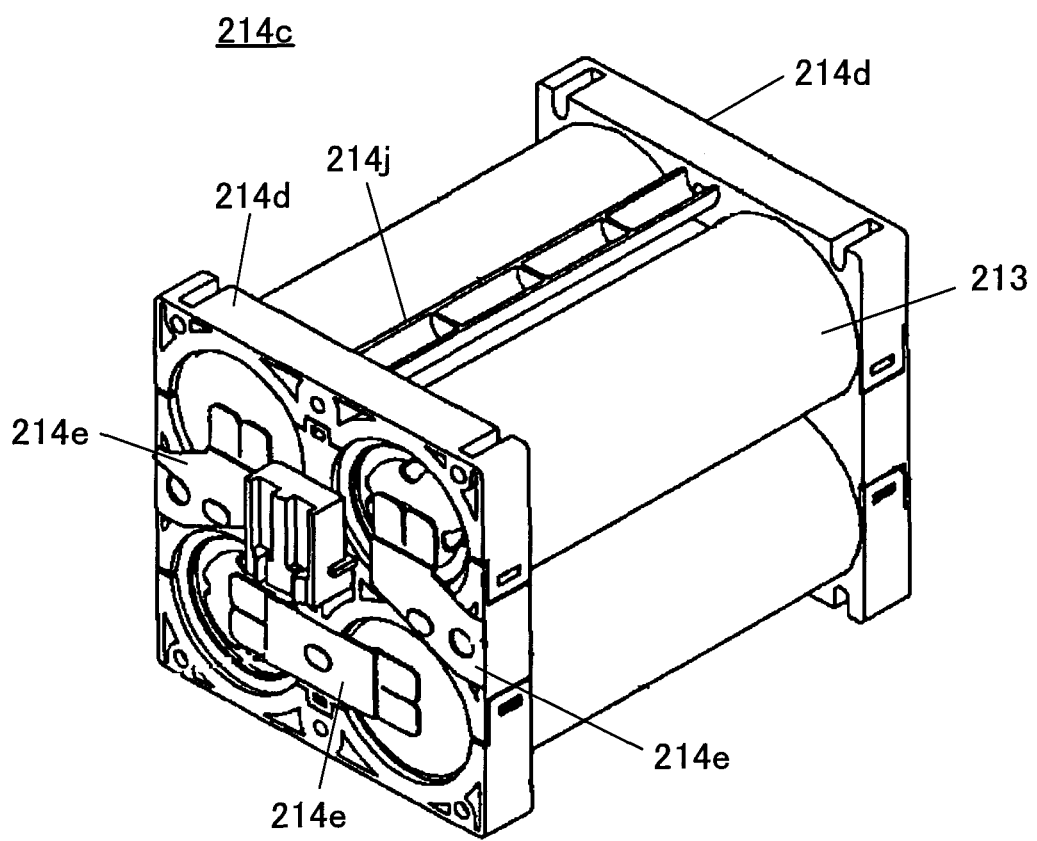
FIG. 8 is a perspective view showing the external structural appearance of a assembled battery included in the assembled battery unit of FIG. 7.

Each assembled battery (first sub-assembly unit) 214*c* is an assembly of four cylinder shaped or circular post shaped lithium battery cells 213, into a single group (refer to FIG. 8). These four lithium battery cells 213 are arranged so that their central axes are parallel in two groups of two, upon two levels, i.e. one to the upper left, one to the upper right, one to the lower left, and one to the lower right, i.e. so that their circumferential surfaces oppose one another, with their positive terminals and negative terminals (i.e. their top surfaces and bottom surfaces) facing in opposite directions alternately, and, from both their ends in their axial directions, they are held between holders 214*d* made from synthetic resin of high insulating quality. The polarities of the terminals facing each of the holders 214*d* of the pair of lithium battery cells 213 adjacent to one another on each of the four sides of the assembly are opposite. By the circumferential surfaces of the lithium battery cells 213 being arranged so as to face one another in this manner, it is possible to build the assembled batteries 214*c* to be compact. Moreover, since the external terminals of the four lithium battery cells 213 (i.e. their positive and negative terminals) are arranged in a regular manner along the same direction, accordingly, in addition to enhancing the ease of manufacture, also it is possible to maintain the security of the structure, and this is also satisfactory from the point of view of maintenance. Furthermore, the resistance to vibration in the vehicle mounted state is enhanced, and the resistance to mechanical shock in the event of the vehicle becoming involved in a traffic accident is also satisfactory.

Bus bars 214*e* made from copper, that are electrically conductive connection members, are attached by welding to the terminal faces of the four lithium cells 213 that are exposed from the holder 214*d*, so that the four lithium battery cells 213 are electrically connected in series. The direction in which the lithium battery cells 213 in one holder 214*d* are electrically connected by their bus bars 214*e*, and the direction in which the lithium battery cells 213 in the other holder 214*d* are electrically connected by their bus bars 214*e* are different. At the other holder 214*d*, the upper and lower adjacent lithium battery cells 213 are electrically connected together by the bus bars 214*e*. However, at the one holder 214*d*, the two lower adjacent lithium battery cells 213 are electrically connected together by one of the bus bars 214*e*, while each of the upper lithium battery cells 213 is electrically connected to a lithium battery cell 213 of the next adjacent assembled battery 214*c* by another of the bus bars 214*e*. Due to this, the bus bar 214*e* that joins together these two lithium battery cells 213 has a shape that is different from that of the other bus bar 214*e*: at the side edge portion of the holder 214*d*, the structure makes it possible to connect to the bus bar 214*e* that joins to a lithium battery cell 213 of the adjacent other assembled battery 214*c* via an electrically conductive link member 214*f* (see FIG. 7). This bus bar 214*e* is embedded in the holder 214*d* by insert molding.

A temperature sensor 270 is adhered to the four lithium cells 213 of a specified assembled battery 214*c* that is determined in advance (in this embodiment, the assembled battery 214*c* nearest to the exhaust aperture 217), and temperature detection wires are extended from this temperature sensor 270. Furthermore, voltage detection lines 235 are extended from each of the assembled batteries 214*c*.

The lithium battery cells 213 are ones that use lithium manganese complex oxide as their positive electrode active material and amorphous carbon as their negative electrode active material, and their nominal output voltage is 3.6 V and their capacity is 5.5 Ah. It should be understood that the terminal voltage of the lithium battery cells 213 changes when their state of charge changes. When the amount of charge has dropped, the terminal voltage of the lithium battery cells 213 drops down as low as 2.5 volts, whereas when the amount of charge has increased, the terminal voltage of the lithium cells rises as high as 4.3 volts.

Gaps are defined between the adjacent left and right lithium battery cells 213 and upper and lower locations on the holder 214*d*, and arc shaped louvers 214*j* are provided in these gaps for conducting cooling air currents to the circumferential surfaces around the outsides of the lithium battery cells 213. Furthermore, along with a gap being defined at the center between the four lithium cells that are centered in the holder 214*d* and the holder 214*d*, also a cross shaped louver 214*k* having a cruciform cross sectional shape is disposed therein for conducting a cooling air current to the circumferential surfaces of the lithium battery cells 213, of which surfaces facing to each other.

Figure 7:
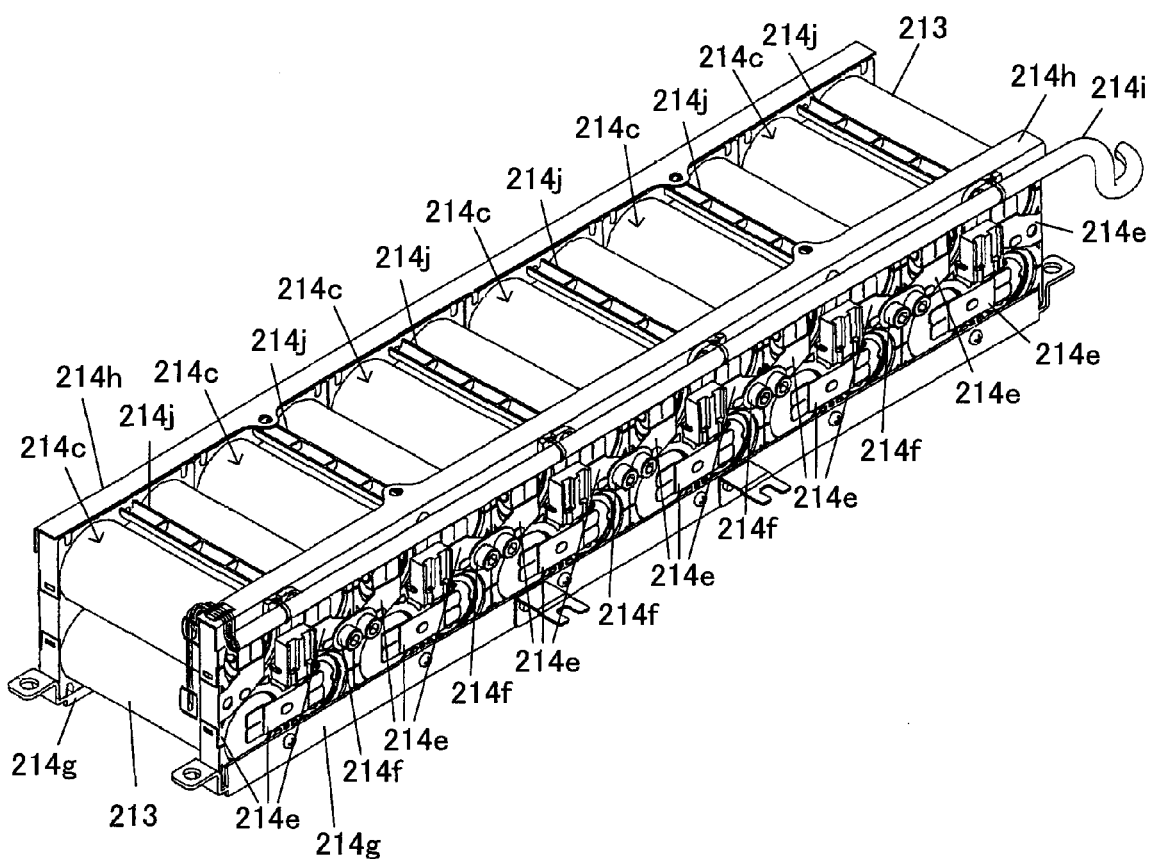
FIG. 7 is a perspective view showing the external structural appearance of a assembled battery unit included in the assembled battery module of FIG. 5.

Each of the two assembled battery units (second sub-assembly units) 214*a* and 214*b* includes six assembled batteries 214*c* (refer to FIG. 7). These six assembled batteries 214*c* are arranged in one row, with the central axes of all of their lithium battery cells 213 parallel; or to put it in another manner, so that the outer circumferential surfaces of the lithium cells oppose one another. This block of the six assembled batteries 214*c* is fixed at its two lower edge portions by two elongated channel shaped block bases 214*g* having approximate letter-h cross-sectional shapes and arranged so as to confront one another, and is fixed at its two upper edge portions by two elongated channel shaped block reinforcement plates 214*h* having approximate letter-L cross-sectional shapes and arranged so as to confront one another. Furthermore, the bus bars 214*e* of adjacent ones of the assembled batteries 214*c* are linked together via link members 214*f*. Since, in this embodiment, the construction is such that the assembled batteries 214*c* are fixed to the parallel block bases 214*g*, accordingly the ease of assembly and convenience of service are enhanced. Moreover, in this embodiment, since the block structure consisting of the assembly of the assembled batteries 214*c* is fixed by the block reinforcement plates 214*h*, accordingly this block structure of the assembled batteries 214*c* is reinforced. Yet further, in this embodiment, the productivity during production of the battery groups 214 is enhanced, and it becomes possible to establish a constructional and dimensional relationship in common with battery groups for other power supply systems, and moreover checking of the battery cells for product quality management and maintenance after production are also both excellent.

A harness group 214*i* is fixed along the edge of one of the block reinforcement plates 214*h*, and includes voltage detection lines for detecting the voltages of the lithium battery cells 213 and a temperature detection line extending from the temperature sensor 270, bundled together by cable ties or the like. Since, in this embodiment, the harness group 214i is bundled together and fixed to the block reinforcement plate 214h, accordingly the mechanical strength in relation to vibration or shock or the like applied to the harness group 214i is excellent, and the ease of working for electrical connection is enhanced.

The two assembled battery units (second sub-assembly units) 214a and 214b are held as two-assembled battery rows that lie side by side across the transverse direction of the module case 215 (the lower container 215b) (refer to FIG. 5), so that the direction in which the assembled batteries 214c are arranged is the longitudinal direction of the module case 215 (the lower container 215b), and are electrically connected in series by assembled battery unit connection bus bars not shown in the figures.

A cell control device box 215c in which is housed the circuit substrate 232 upon which are mounted the electronic circuit components that make up the cell control device 230, such as the integrated circuits 231, the photo-couplers 240, the resistors 234 and so on, is disposed at one end of the module case 215 in the longitudinal direction, and is fixed there with screws or the like. One of the integrated circuits 231 corresponds to each of the assembled batteries 214c. The harness groups 214i of the two assembled battery units 214a and 214b extend to this cell control device box 215c. A connector provided at the end of one of the harness groups 214i is connected to a connector upon the circuit substrate 232 from one transverse direction of the module case 215. And a connector provided at the end of the other one of the harness groups 214i is connected to a connector upon the circuit substrate 232 from the other transverse direction of the module case 215.

A positive side high current cable 214l that is electrically connected to the positive side of the batter group 214, and a negative side high current cable 214m that is connected to the negative side of the battery group 214, extend out from the side wall of the module case at its other end in the longitudinal direction (i.e. from the opposite end to the one at which the cell control device box 215c is provided). The nominal output voltage of an assembled battery module 210 is 170 V, and its capacity is 5.5 Ah. It should be understood that, since the terminal voltages of the lithium secondary batteries vary according to their states of charge, accordingly the actual terminal voltage varies on the basis of the state of charge.

The lower level control device 220 decides whether it is necessary to perform cooling of the battery module set 200 from the temperature information detected on the basis of the plurality of temperature sensors 270 (for example, it may compare this temperature information with a temperature threshold value, and may decide that cooling is required when a detected temperature becomes greater than the temperature threshold value); and, when the lower level control device 220 has decided that cooling is required, it operates the fan unit 280. Due to this, air is sucked into the intake duct 930 as cooling are, and is blown into the intake side vent duct 290. This cooling air that has been drawn in is divided as it passes through the assembled battery module 210, and flows via the air intake slot 216 into the internal ducting in the lower portion of the module case 215, so as to flow towards the exhaust aperture 217. This cooling air that flows into the interior of the ducting then flows via the intake apertures 215e of the reinforcement louver 215d between the lithium battery cells 213 of the battery groups 214. And the cooling air that has thus flowed in between the lithium battery cells 213 of the battery groups 214 flows from the lower portion of the interior of the module case 215 into its upper portion. At this time, the flow of the cooling air is controlled by the arch shaped louver 214j and the cross shaped louver 214k, so that it flows around the external circumferences of the lithium battery cells 213. Due to this, the battery group 214 (that includes 48 of the lithium battery cells 213) is cooled. After having thus performed cooling, this cooling air flows from the upper portion of the module case 215 towards the exhaust aperture 217, and is discharged from the exhaust aperture 217 at the lower portion of the module case 215 to the exhaust vent duct 291. The cooling air flows that have been discharged from the assembled battery modules 210 to the exhaust vent duct 291 come together in the interior of the exhaust vent duct 291, and are then discharged from the opening portion of the exhaust vent duct 291 into the interior of the casing 900. And this cooling air that has been discharged into the interior of the casing 900 is then discharged to the exterior from the exhaust aperture 920.

<Control Method for the Master Battery Control Device 100>

Figure 9:
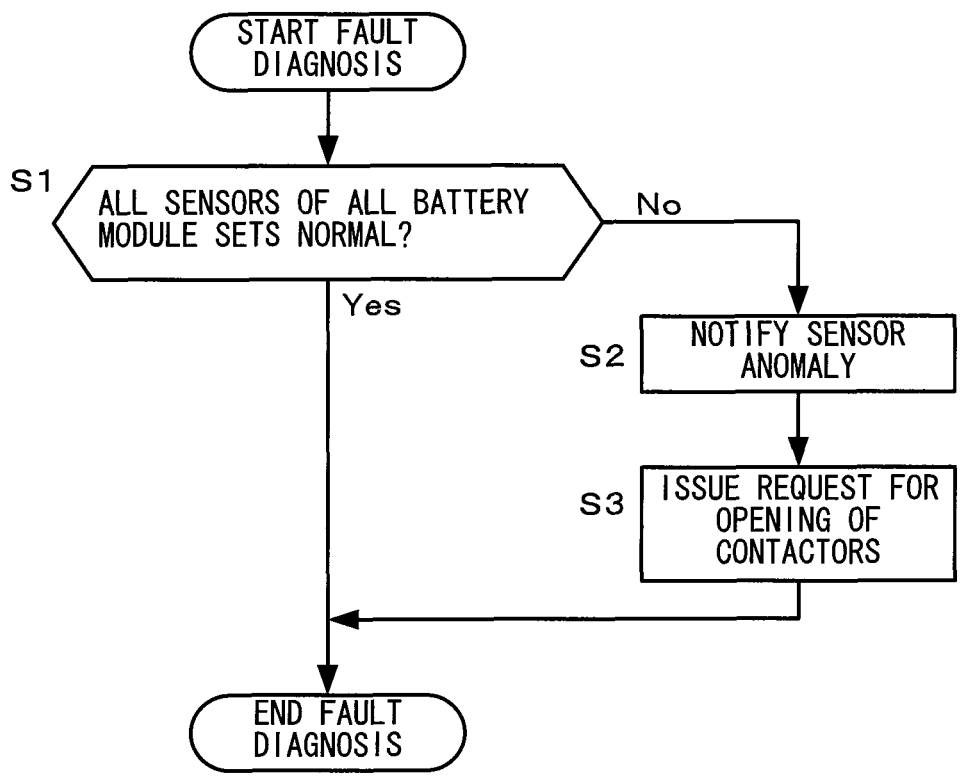
FIG. 9 is a flow chart showing a prior art type of fault diagnosis operation for a battery storage system.

Next, the control method for the master battery control device 100 will be explained with reference to FIGS. 9 and 10.

During discharge of the battery storage system 1000, the local battery control devices 220, 320, 420, and 520 detect the total voltages of the assembled battery modules 210, 310, 410, and 510 from the output signals of the voltage sensors 260, 360, 460, and 560, detect the total current from the output signals of the current sensors 250, 350, 450, and 550, and detect the temperatures of the assembled battery modules 210, 310, 410, and 510 from the output signal of the temperature sensor 270; and, on this basis of this data, the local battery control devices 220, 320, 420, and 520 calculate the amount of power that can be outputted from the assembled battery modules 210, 310, 410, and 510, and notify all this data to the master battery control device 100. And the master battery control device 100, along with aggregating the data acquired from the local battery control devices 220, 320, 420, and 520 such as the total voltage, the total current, the temperature, the amount of power that can be outputted and so on, as data for the battery storage system 1000, also calculates the total amount of power that can be outputted from the electrical control device 1000, and notifies this data to the motor control device 11 or to the vehicle control device 41. Then the motor control device 11 controls the operation of the second power conversion device 7 on the basis of this data, so that it extracts DC power from the battery storage system 1000 while taking the total amount of power that can be outputted therefrom as an upper limit. And the second power conversion device 7 converts this DC power that has been extracted into three phase AC power that it supplies to the motor-generator 4, thus driving the motor-generator 4.

And, during charging of the battery storage system 1000, DC power generated by the motor-generator 4 is supplied from the second power conversion device 7 to the battery storage system 1000. At this time, the local battery control devices 220, 320, 420, and 520 detect the total voltage of the assembled battery modules 210, 310, 410, and 510 from the output signals of the voltage sensors 260, 360, 460, and 560, detect the total current from the output signals of the current sensors 250, 350, 450, and 550, and detect the temperatures of the assembled battery modules 210, 310, 410, and 510 from the output signal of the temperature sensor 270; and, on this basis of this data, the local battery control devices 220, 320, 420, and 520 calculate the amount of power that can be inputted to the assembled battery modules 210, 310, 410, and 510, and notify all this data to the master battery control device 100. And the master battery control device 100, along with aggregating the data acquired from the local battery control devices 220, 320, 420, and 520 such as the total voltage, the total current, the temperature, the amount of power that can be outputted and so on, as data for the battery storage system 1000, also calculates the total amount of power that can be inputted to the electrical control device 1000, and notifies this data to the motor control device 11 or to the vehicle control device 41. Then the motor control device 11 controls the operation of the second power conversion device 7 on the basis of this data, so that it supplies DC power to the battery storage system 1000 while taking the total amount of power that can be inputted thereto as an upper limit; and thus the battery storage system 1000 is charged up.

The total voltages of the assembled battery modules 210, 310, 410, and 510 may be detected from the output signals of the voltage sensors 260, 360, 460, and 560. On the other hand, the voltages of the assembled battery modules 210, 310, 410, and 510 may be detected by the cell control device 230. Moreover, the operational state of each of the assembled battery modules 210, 310, 410, and 510 may also be detected by the cell control device 230. However, since the voltage detection by the cell control device 230 occupies a certain period of time, in normal charge and discharge control of the battery storage system 100, the voltage detected by the cell control device 230 is not utilized, but rather the voltages detected from the output signals of the voltage sensors 260, 360, 460, and 560 are utilized, since they are capable of detecting voltage in a short time period.

Furthermore, with regard to the total current, the current that is detected from the output signals of the current sensors 250, 350, 450, and 550 is utilized. With regard to the temperature, the highest temperature, the minimum temperature, the average temperature, and the like are calculated on the basis of the plurality of temperatures detected from the output signals of the plurality of temperature sensors 270, 370, 470, and 570 respectively provided to the assembled battery modules 210, 310, 410, and 510, and these calculated values are utilized.

The local battery control devices 220, 320, 420, and 520 notify the output signals from the voltage sensors 260, 360, 460, and 560, from the current sensors 250, 350, 450, and 550, and from the plurality of temperature sensors 270, 370, 470, and 570, to the master battery control device 100 on a fixed cycle. If a fault has occurred in any one of the voltage sensors 260, 360, 460, and 560, the current sensors 250, 350, 450, and 550, and the plurality of temperature sensors 270, 370, 470, and 570, then no reliance can be placed upon the value detected on the basis of the output signal of that sensor, so that it is not possible to perform control adequately. Due to this, the local battery control devices 220, 320, 420, and 520 perform diagnosis as to whether or not the voltage sensors 260, 360, 460, and 560, the current sensors 250, 350, 450, and 550, and the plurality of temperature sensors 270, 370, 470, and 570 are operating correctly, and, if it has been determined that a fault has occurred, this fact is notified to the master battery control device 100. For example, if the value detected from the output signal of a sensor is outside a reference range that is set in advance, then it may be decided that an anomaly of some sort has occurred in this sensor, so that it may be determined to be faulty.

Here, the method of control performed by the battery storage system 100 will be explained by taking, as an example, the case in which the voltage sensor 260 is faulty. Now, if the value detected from the output signal of the voltage sensor 260 has become outside a reference range that is set in advance, then the local battery control device 220 decides that some type of fault has occurred with this voltage sensor 260. For example, if due to some cause the voltage sensor 260 has short circuited to GND (the vehicle body earth), then the detected value becomes zero, and it is determined that a fault is occurring. The local battery control device 220 notifies the occurrence of this fault in the voltage sensor 260 via its communication line to the master battery control device 100.

And, along with notifying the fault in the voltage sensor to the motor control device 11 or to the vehicle control device 41 via their communication line, the master battery control device 100 also requests the motor control device 11 or the vehicle control device 41 to open the first and second positive side main contactors 800 and 801 and the first and second negative side main contactors 810 and 811. When the first and second positive side main contactors 800 and 801 and the first and second negative side main contactors 810 and 811 are opened, the input and output of power to and from the battery storage system 1000 are cut off, and the battery storage system 1000 goes into its usage prohibited state. Furthermore, even when this fault in the voltage sensor 260 has been recovered, this usage prohibited state is continued, until the battery storage system 1000 is restarted.

This fault diagnosis operation by the battery storage system 1000 described above is not limited to the voltage sensors, but is operation that is common to all of the sensors, including the current sensor and the temperature sensors and so on. FIG. 9 is a flow chart showing the fault diagnosis operation by the battery storage system 1000 if it were to be performed as it has been in the prior art. In a step S1, a decision is made as to whether or not all of the sensors of all of the battery module sets 200, 300, 400, and 500 are normal, and if they are all normal, this fault diagnosis terminates. On the other hand, if it has been decided that at least one of the sensors is anomalous, then the flow of control proceeds to a step S2, in which, from the local battery control device for the battery module set in which the sensor anomaly has been detected, for example from the local battery control device 220 for the battery module set 200, a sensor anomaly is notified to the motor control device 11 or to the vehicle control device 41 via the master battery control device 100, and next in a step S3 a request is issued from the master battery control device 100 to the motor control device 11 or to the vehicle control device 41 to open the first and second positive side main contactors 800 and 801 and the first and second negative side main contactors 810 and 811. Due to this, the first and second positive side main contactors 800 and 801 and the first and second negative side main contactors 810 and 811 are opened, so that the input and output of power to and from the battery storage system 1000 are intercepted.

Now, if only the voltage sensor that is being used for a single battery module set of the battery storage system 1000 is faulty, while the other sensors are operating normally, then it is considered that the severity of this type of fault is slight. Thus, in this embodiment, if this type of slight fault has occurred, the master battery control device 1000 estimates the total amounts of input and output power for the battery storage system 1000, not using the detected voltage value of the battery module set in which the fault is occurring and the power that can be inputted and outputted to and from the battery module set as calculated on the basis of this detected voltage value, but rather using only the detected voltage values for the battery module sets that are operating normally and the power that can be inputted and outputted to and from those battery module sets, and notifies the result to the vehicle control device 41. Furthermore, the master battery control device 100 transmits an error code carrying information specifying that a fault has occurred in the voltage sensor 260 of the battery storage system 1000 to the motor control device 11 or to the vehicle control device 41. Then the motor control device 11 or the vehicle control device 41 displays this fault information, thus notifying it to the user of the vehicle and the appropriate service personnel. And, on the basis of this fault information, the user of the vehicle or the appropriate service personnel can perform inspection of the battery storage system 1000 and repairs to it.

While, with a battery storage system 1000 of a prior art type, a request is issued for opening of the first and second positive side main contactors 800 and 801 and the first and second negative side main contactors 810 and 811 when a fault has occurred, by contrast, in this embodiment, when a slight fault has occurred, no request is issued for opening of the first and second positive side main contactors 800 and 801 and the first and second negative side main contactors 810 and 811. However, taking into account also the influence upon the assembled battery modules, the total power that can be inputted and outputted is limited to, for example, 50% of the calculated value. Moreover, in this embodiment, if the fault in the sensor has been recovered from, along with clearing the notification of fault information to the motor control device 11 or the vehicle control device 41, also the limitation upon the power that can be inputted and outputted is removed, so that the system returns to normal charge and discharge control.

Figure 10:
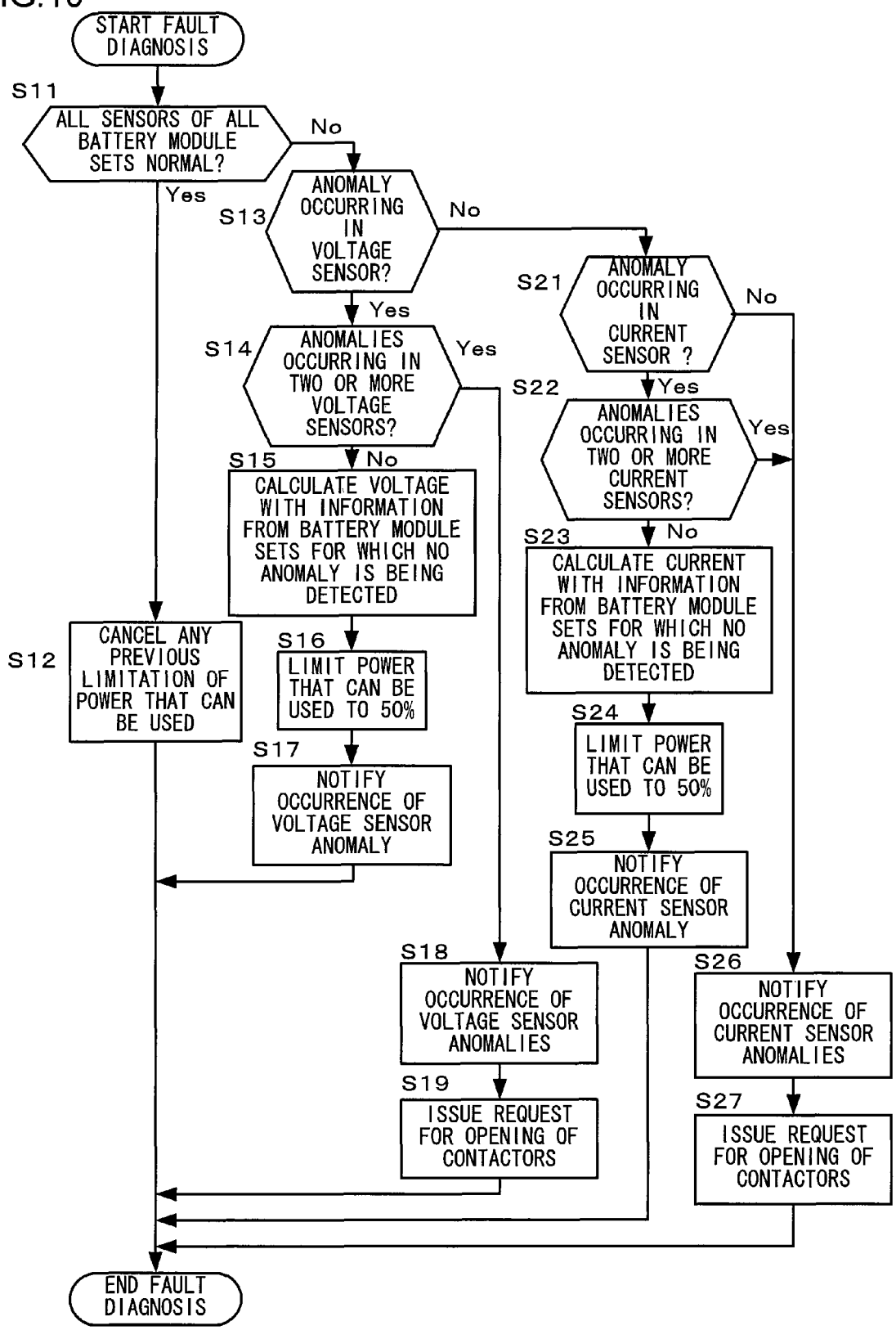
FIG. 10 is a flow chart showing fault diagnosis operation according to the present invention for the battery storage system mounted as the drive power supply in FIG. 1.

FIG. 10 is a flow chart showing the fault diagnosis operation executed by the battery storage system 1000 of this embodiment. The master battery control device 100 executes this fault diagnosis operation at predetermined intervals. In a step S11, each item of the data for voltage, current and temperature inputted from the local battery control devices 220, 320, 420, and 520 is compared with its set range, and a decision is made as to whether or not all of the voltage sensors 260, 360, 460, and 560, the current sensors 250, 350, 450, and 550, and the plurality of temperature sensors 270, 370, 470, and 570 are operating normally. If it has been decided that all of the sensors are normal, then the flow of control proceeds to a step S12, and, along with canceling any fault notification that has been previously issued to the motor control device 11 or the vehicle control device 41, also any previous limitation upon the total amounts of power that can be inputted and outputted is removed.

On the other hand, if an anomaly has been detected in any one of the voltage sensors 260, 360, 460, and 560, the current sensors 250, 350, 450, and 550, and the plurality of temperature sensors 270, 370, 470, and 570, then the flow of control proceeds to a step S13, in which it is determined whether or not an anomaly has been detected in one of the voltage sensors 260, 360, 460, and 560. If an anomaly in one of the voltage sensors 260, 360, 460, and 560 has been detected, then the flow of control proceeds to a step S14, in which it is determined whether or not anomalies in two or more of the voltage sensors 260, 360, 460, and 560 have been detected. If an anomaly has only been detected in one of the voltage sensors 260, 360, 460, and 560, then the flow of control proceeds to a step S15, in which the voltage is calculated using only the data from the battery module sets in which no anomaly is being detected. And then, in a step S16, the amount of power that can be used is limited to 50%.

In the next step S17, the occurrence of the anomaly in the voltage sensor is notified to the motor control device 11 or the vehicle control device 41, and also the limitation of the amount of power that can be used is notified. Moreover, if an anomaly in two or more of the voltage sensors 260, 360, 460, and 560 has been detected in the step S14, then the flow of control is transferred to a step S18, in which the occurrence of these anomalies in the voltage sensors is notified to the motor control device 11 or the vehicle control device 41. And then, in a step S19, a request is issued to the motor control device 11 or the vehicle control device 41 for opening of the first and second positive side main contactors 800 and 801 and the first and second negative side main contactors 810 and 811.

But if, in the step S13, it is determined that the anomaly that has been detected is not an anomaly in a voltage sensor, then the flow of control is transferred to a step S21, in which it is determined whether or not an anomaly has been detected in one of the current sensors 250, 350, 450, and 550. If an anomaly in one of the current sensors 250, 350, 450, and 550 has been detected, then the flow of control proceeds to a step S22, in which it is determined whether or not anomalies in two or more of the current sensors 250, 350, 450, and 550 have been detected. If an anomaly has only been detected in one of the current sensors 250, 350, 450, and 550, then the flow of control proceeds to a step S23, in which the current is calculated using only the data from the battery module sets in which no anomaly is being detected. And then, in a step S24, the amount of power that can be used is limited to 50%.

In the next step S25, the occurrence of the anomaly in the current sensor is notified to the motor control device 11 or the vehicle control device 41, and also the limitation of the amount of power that can be used is notified. Moreover, if an anomaly in two or more of the current sensors 250, 350, 450, and 550 has been detected in the step S22, then the flow of control is transferred to a step S26, in which the occurrence of these anomalies in the current sensors is notified to the motor control device 11 or the vehicle control device 41. And then, in a step S27, a request is issued to the motor control device 11 or the vehicle control device 41 for opening of the first and second positive side main contactors 800 and 801 and the first and second negative side main contactors 810 and 811.

Next, the method employed in this embodiment for calculating the voltages, the currents, and the amounts of power that can be inputted and outputted will be explained with reference to Tables 1 through 7. In these tables, "String1" denotes the first series circuit of the battery module set 200 and the battery module set 300, while "String2" denotes the second series circuit of the battery module set 400 and the battery module set 500. Furthermore, "Vsensor_a", "Vsensorb", "Vsensor_c", and "Vsensor_d" respectively denote the voltage sensors 260, 360, 460, and 560, while V1, V2, V3, and V4 respectively denote the voltage values detected from the output signals of the voltage sensors 260, 360, 460, and 560. In a similar manner, "Isensor_a", "Isensor_b", "Isensor_c", and "Isensor_d" respectively denote the current sensors 250, 350, 450, and 550, while I1, I2, I3, and I4 respectively denote the voltage values detected from the output signals of the current sensors 250, 350, 450, and 550. Furthermore, "sensor1" denotes the combination of the voltage sensor 260 and the current sensor 250, "sensor2" denotes the combination of the voltage sensor 360 and the current sensor 350, "sensor3" denotes the combination of the voltage sensor 460 and the current sensor 450, and "sensor4" denotes the combination of the voltage sensor 560 and the current sensor 550. It should be understood that "Min(A,B)" is the function that selects the lesser one of A and B.

TABLE 1

| Vsensor_a | String1 | OK |
|---|---|---|
| Vsensor_b | | OK |
| Vsensor_c | String2 | OK |
| Vsensor_d | | OK |
| Total Voltage | | (V1 + V2) + (V3 + V4))/2 |

Table 1 shows an example of calculation of the total voltage of the battery storage system 1000 when all of the voltage sensors 260, 360, 460, and 560 are normal. If all of the voltage sensors 260, 360, 460, and 560 are normal, then the sum (V1+V2) of the values V1 and V2 detected from the output signals of the respective voltage sensors 260 and 360 of the two battery module sets 200 and 300 that constitute the first series circuit (String1), and the sum (V3+V4) of the values V3 and V4 detected from the output signals of the respective voltage sensors 460 and 560 of the two battery module sets 400 and 500 that constitute the second series circuit (String2), are calculated, and the average value of these sums {(V1+V2)+(V3+V4)}/2 is taken as being the voltage between the positive terminal 600 and the negative terminal 610, in other words as being the total voltage of the battery storage system 1000.

TABLE 2

| Vsensor_a | String1 | NG | OK | OK | OK |
|---|---|---|---|---|---|
| Vsensor_b | | OK | NG | OK | OK |
| Vsensor_c | String2 | OK | OK | NG | OK |
| Vsensor_d | | OK | OK | OK | NG |
| Total Voltage | | V3 + V4 | V3 + V4 | V1 + V2 | V1 + V2 |

Table 2 shows an example of calculation of the total voltage of the battery storage system 1000 when an anomaly has been detected in just one of the voltage sensors 260, 360, 460, and 560. In the battery storage system 1000 of this embodiment, along with series circuits being formed by connecting the two battery module sets in series, also two of these series circuits are connected in parallel. Accordingly, if an anomaly has occurred in just a single voltage sensor in either one of the first series circuit (String 1) and the second series circuit (String2), then it is possible to detect the voltage between the positive terminal 600 and the negative terminal 610, in other words the total voltage of the battery storage system 1000, by utilizing the voltage sensors of the other series circuit in which all of the voltage sensors are operating normally. In other words, if there is an anomaly of only a single voltage sensor, then it is nevertheless possible to detect the total voltage of the battery storage system 1000 without any problem.

If it is determined that, in Table 2, the value V1 detected from the output signal of the voltage sensor 260 (Vsensor_a) of the battery module set 200 of the first series circuit (String1) is outside its reference range, so that an anomaly is occurring, then the sum (V3+V4) of the value V3 detected from the output signal of the voltage sensor 460 (Vsensor_c) of the second series circuit (String2) and the value V4 detected from the output signal of the voltage sensor 560 (Vsensor_d) of that series circuit is detected as the total voltage of the battery storage system 1000. Subsequently, if an anomaly has occurred in any one of the voltage sensors 360, 460, and 560 as well, then the total voltage of the battery storage system 1000 can be detected in a similar manner.

TABLE 3

| Isensor_a | String1 | OK |
| --- | --- | --- |
| Isensor_b | | OK |

TABLE 3-continued

| Isensor_c | String2 | OK |
| --- | --- | --- |
| Isensor_d | | OK |
| Total Current | | (I1 + I2)/2 + (I3 + I4)/2 |

Table 3 shows an example of calculation of the total current of the battery storage system 1000 when all of the current sensors 250, 350, 450, and 550 are normal. If all of the current sensors 250, 350, 450, and 550 are normal, then the average value (I1+I2)/2 of the values I1 and I2 detected from the output signals of the respective current sensors 250 and 350 of the two battery module sets 200 and 300 that constitute the first series circuit (String 1), and the average value (I3+I4)/2 of the values I3 and I4 detected from the output signals of the respective current sensors 450 and 550 of the two battery module sets 400 and 500 that constitute the second series circuit (String2), are calculated, and the sum of these {(I1+I2)/2+(I3+I4)/2} is taken as being the current flowing between the positive terminal 600 and the negative terminal 610, in other words as being the total current of the battery storage system 1000.

TABLE 4

| Isensor_a | String1 | NG | OK | OK | OK |
|---|---|---|---|---|---|
| Isensor_b | | OK | NG | OK | OK |
| Isensor_c | String2 | OK | OK | NG | OK |
| Isensor_d | | OK | OK | OK | NG |
| Total Current | | I2 + (I3 + I4)/2 | I1 + (I3 + I4)/2 | (I1 + I2)/2 + I4 | (I1 + I2)/2 + I3 |

Table 4 shows an example of calculation of the total current of the battery storage system 1000 when an anomaly has been detected in just one of the current sensors 250, 350, 450, and 550. Since, in the battery storage system 1000 of this embodiment, the first series circuit (String1) and the second series circuit (String2) are each formed by connecting two battery module sets in series, accordingly, if an anomaly has occurred in just a single current sensor of a battery module set of either one of these series circuits, then it is possible to take the value detected from the output signal of the current sensor of the other battery module set of this series circuit, as being the current flowing in that series circuit.

If it is determined that, in Table 4, the value I1 detected from the output signal of the current sensor 250 (Isensor_a) of the battery module set 200 of the first series circuit (String1) is outside its reference range, so that an anomaly is occurring, then the value I2 detected from the output signal of that current sensor 350 (Isensor_b) of this first series circuit String1 in which no anomaly is being detected is taken as being the current in this first series circuit. On the other hand, for the second series circuit, as described above, the average value (I3+I4)/2 of the values I3 and I4 detected by the current sensors 450 and 550 is taken as being the current in the second series circuit String2. And the sum {I2+(I3+I4)/2} of the current I2 in the first series circuit String1 and the current (I3+I4)/2 in the second series circuit String2 is detected as being the total current of the battery storage system 1000. Subsequently, if an anomaly has occurred in any one of the current sensors 350, 450, and 550 as well, then the total current of the battery storage system 1000 can be detected in a similar manner.

Next, an example of calculation of the power that can be inputted and outputted will be explained with reference to Tables. 5 through 7.

It should be understood that the total power that can be outputted from the battery storage system 1000 is the available power that can be discharged from the battery storage system 1000 via its positive terminal 600 and its negative terminal 610 to the second power conversion device 7. And the total power that can be inputted to the battery storage system 1000 is the available power that can be charged into the battery storage system 1000 via its positive terminal 600 and its negative terminal 610 from the second power conversion device 7.

TABLE 5

| sensor1 | String1 | OK |
| sensor2 | | OK |
| sensor3 | String2 | OK |
| sensor4 | | OK |
| Available Power | | Min(Pw1, Pw2, Pw3, Pw4)*4 |

Table 5 shows an example of calculation of the power that can be inputted and outputted when all of the voltage sensors 260, 360, 460, and 560 and all of the current sensors 250, 350, 450, and 550 are normal. If no anomaly is being detected in any of the voltage sensors 260, 360, 460, and 560 and the current sensors 250, 350, 450, and 550, then the powers Pw1, Pw2, Pw3, and Pw4 that can be inputted and outputted are calculated on the basis of the voltage values detected from the output signals of the voltage sensors and the current values detected from the output signals of the current sensors of each of the battery module sets 200, 300, 400, and 500, and four times the minimum Min(Pw1, Pw2, Pw3, Pw4) of those values is taken as being the total amount of power that can be inputted and outputted. It should be understood that explanation of the method for calculating the power that can be inputted and outputted to and from the battery module sets 200, 300, 400, and 500 is omitted, since it is per se known.

TABLE 6

| sensor1 | String1 | NG | OK | OK | OK |
| sensor2 | | OK | NG | OK | OK |
| sensor3 | String2 | OK | OK | NG | OK |
| sensor4 | | OK | OK | OK | NG |
| Power | | Min (Pw2, Pw3, Pw4) * 4 * 50% | Min (Pw1, Pw3, Pw4) * 4 * 50% | Min (Pw1, Pw2, Pw4) * 4 * 50% | Min (Pw1, Pw2, Pw3) * 4 * 50% |

Table 6 shows an example of calculation of the total power that can be inputted or outputted when an anomaly has been detected in just one of the voltage sensors 260, 360, 460, and 560 or in one of the current sensors 250, 350, 450, and 550 of one of the battery module sets 200, 300, 400, and 500. When an anomaly is occurring in one of the voltage sensors 260, sensors 250, 350, 450, and 550 of one of the battery module sets 200, 300, 400, and 500, then the total power that can be inputted and outputted to and from the battery storage system 1000 is calculated using the power that can be inputted and outputted as calculated for the other battery module sets for which no sensor anomaly has been detected, but not using the power that can be inputted and outputted as calculated for that battery module set for which the sensor anomaly has been detected. And the calculated power that can be inputted and outputted is further limited by a predetermined proportion (for example, in this embodiment, 50%), so as to provide protection for the battery module set in which the sensor anomaly has been detected.

If it is determined that, in Table 6, the value detected from the output signal of the voltage sensor 260 or the current sensor 250 of the battery module set 200 of the first series circuit (String1) is outside its reference range, so that it is determined that an anomaly is occurring, then the total power that can be inputted and outputted to and from the battery storage system 1000 is calculated using the powers that can be inputted and outputted Pw2, Pw3, and Pw4 as calculated for the other battery module sets 300, 400, and 500 for which no sensor anomaly has been detected, but not using the power that can be inputted and outputted as calculated on the basis of the values detected from the output signals of the voltage sensor 260 and the current sensor 250 of the battery module set 200. In concrete terms, the minimum Min(Pw2, Pw3, Pw4) of the powers that can be inputted and outputted to and from the battery module sets 300, 400, and 500 is multiplied by 4, and then is further limited by 50%. It should be understood that, if an anomaly has been detected in one of the voltage sensors 360, 460, and 560, or in one of the current sensors 350, 450, and 550 of the battery module sets 300, 400, and 500, then the calculation is performed in a similar manner.

TABLE 7

| sensor1 | String1 | NG | NG | NG | OK | OK | OK |
| sensor2 | | NG | OK | OK | NG | NG | OK |
| sensor3 | String2 | OK | NG | OK | NG | OK | NG |
| sensor4 | | OK | OK | NG | OK | NG | NG |
| Power | | Min (Pw3, Pw4) * 4 * 50% | Min (Pw2, Pw4) * 4 * 50% | Min (Pw2, Pw3) * 4 * 50% | Min (Pw1, Pw4) * 4 * 50% | Min (Pw1, Pw3) * 4 * 50% | Min (Pw1, Pw2) * 4 * 50% |

360, 460, and 560 or in one of the current sensors 250, 350, 450, and 550 of one of the battery module sets 200, 300, 400, and 500, then it is supposed that it is not possible to rely upon the power that can be inputted and outputted calculated on the basis of the value detected from the output signal of that sensor. Thus, if an anomaly has been detected in one of the voltage sensors 260, 360, 460, and 560 or in one of the current FIG. 7 shows an example of calculation of the power that can be inputted and outputted, when anomalies have been detected in two of the voltage sensors 260, 360, 460, and 560 or the current sensors 250, 350, 450, and 550 that are provided to the battery storage system 1000. In this case as well, in an analogous manner to the case in which a single sensor anomaly is occurring, the total amount of power that can be inputted to and outputted from the battery storage system 1000 is calculated using the calculated powers that can be inputted and outputted to and from the other battery module sets in which no sensor anomaly is being detected, but not using the power that can be inputted and outputted to and from the one or two battery module sets in which a sensor anomaly is being detected. And this calculated total power that can be inputted and outputted is limited by a predetermined proportion (for example, in this embodiment, 50%), so as to provide protection for the battery module set in which the sensor anomaly has been detected.

In the above, in the example of calculation of the power that can be inputted and outputted when anomalies in two sensors have been detected, the combination of two sensors is limited to being any one of the voltage sensors 260, 360, 460, and 560, and any one of the current sensors 250, 350, 450, and 550. If anomalies have been detected in two voltage sensors, or anomalies have been detected in two current sensors, then in some cases it becomes impossible to perform voltage detection or current detection, and the total power that can be inputted to and outputted from the battery storage system 1000 is set to zero, since the condition that the security of the vehicle must be maintained is a rigorous one.

In Table 7, if it is determined that the value detected from the output signal of the voltage sensor 260 or the current sensor 250 of the battery module set 200 of the first series circuit (String1) is outside its reference range, so that an anomaly in this sensor is determined upon, and if moreover it is determined that the value detected from the output signal of the voltage sensor 360 or the current sensor 350 of the battery module set 300 of the second series circuit (String2) is outside its reference range, so that an anomaly in this sensor is also determined upon, then the total power that can be inputted and outputted to and from the battery storage system 1000 is calculated, not by using the powers that can be inputted and outputted calculated for the battery module sets 200 and 300 in which these sensor anomalies have been detected (that would be Pw1 and Pw2), but rather by using the powers Pw3 and Pw4 that can be inputted and outputted as calculated for the other two battery module sets 400 and 500 in which no sensor anomalies have been detected. In concrete terms, the minimum Min(Pw3, Pw4) of the powers Pw3 and Pw4 that can be inputted and outputted to and from the battery module sets 400 and 500 is multiplied by 4, and then is further limited by 50%. It should be understood that the calculation is performed in a similar manner as well, if anomalies have been detected in two sensors in the other battery module set.

Now in the example, explained with reference to FIG. 7, of calculation of the power that can be inputted and outputted when anomalies in two sensors have been detected, although the total power that can be inputted to and outputted from the battery storage system is set to zero if the anomalies have occurred in two sensors that are of the same type, nevertheless sometimes, depending upon the particular combination, it may happen that no problem occurs in the calculation. In this case, it becomes possible to perform the calculation in the same manner as described above, and it becomes possible to elaborate a system for producing the data for the total amount of power that can be inputted and outputted. For example, in relation to voltage, even if anomalies are detected in both of the two voltage sensors of the two battery module sets that are included in one of the series circuits, then it is reasonable to assume that these voltages are actually the same as the voltages that are detected of the two battery module sets that are included in the other series circuit. Accordingly, in this type of case, the same calculation is performed as when anomalies are present in both sensor 1 and sensor 2 of Table 7, or anomalies are present in both sensor 3 and sensor 4, so that it is possible to calculate the total power that can be inputted and outputted to and from the battery storage system 1000.

Furthermore while, in this embodiment, an example has been disclosed in which the ratio for limitation of the total amount of power that can be inputted or outputted if anomalies are detected in two of the sensors is 50%, it would also be acceptable to arrange to change the ratio for limitation of the total amount of power that can be inputted or outputted, according to the number of sensors in which an anomaly has occurred. For example, if an anomaly has been detected in a single sensor, this ratio for limitation may be taken as 75%, whereas if anomalies have been detected in two of the sensors, this ratio for limitation may be taken as 50%. Moreover, it would also be acceptable to arrange to change the ratio for limitation of the total amount of power that can be inputted or outputted, according to the type of sensor or sensors in which anomaly has been detected. For example, if anomalies have been detected in two of the voltage sensors, the ratio for limitation may be taken as 50%, whereas if anomalies have been detected in two of the current sensors, the ratio for limitation may be taken as 75%.

Since, in the above, methods have been described for calculating and methods for controlling the voltage, the current, and the power that can be inputted and outputted when one or more sensor anomalies have been detected in the battery module sets 200, 300, 400, and 500, accordingly it is possible to avoid stopping the operation of the vehicle due to a slight fault, and it becomes possible to enable keeping the vehicle running while using the battery storage system 1000 over a longer time period.

Since, according to the embodiment and variant embodiments described above, it is arranged to estimate the total power that can be inputted and outputted for all of the battery module sets on the basis of the power that can be inputted and outputted to and from the other battery module sets, excluding that battery module set in which it has been determined that a fault in a sensor is occurring, accordingly, even though a fault has occurred with one of the battery module sets, still it becomes possible to keep the vehicle running using power from the battery storage system for a longer time period, due to control by the battery storage system 1000 on the basis of information from that other battery module set, so that it is possible to provide a battery storage system 1000 that is highly fault resistant.

Furthermore, it may be arranged for the master battery control device 100 to reduce the total power that can be inputted and outputted, according to the degree of fault of the sensor. In concrete terms, the total power that can be inputted and outputted may be reduced according to the number of sensors in which it has been determined that a fault has occurred, or the total power that can be inputted and outputted may be reduced according to the type of sensor in which it has been determined that a fault has occurred. By doing this, in addition to the advantageous effects described above, it is also possible to enhance the security and the reliability yet further.

The above described embodiments are examples, and various modifications can be made without departing from the scope of the invention.

What is claimed is:
1. A battery storage system, comprising:
 a plurality of battery modules that are electrically connected in series and in parallel, each comprising a plurality of battery cells;

a plurality of sensors provided to each of the plurality of battery modules, that output at least signals corresponding to voltage and current of the each of the battery modules;

a plurality of first control devices each of which is provided to the each of the plurality of battery modules, and obtains a power that can be inputted and outputted to and from the each of the battery modules based upon the voltage and current obtained from the output signals of the sensors of the each of the battery modules; and a second control device that is separate from the first control devices and performs overall control of the plurality of first control devices, wherein the second control device is arranged independently of the battery modules and provided for all of the battery modules, and the second control device is programmed to calculate, when a fault of a sensor in any one of the plurality of battery modules has occurred, a total power that can be inputted and outputted to and from the all of the battery modules, based upon powers each of which can be inputted and outputted to and from each of other battery modules than a battery module in which the sensor has detected the fault, and outputs information of the total power.

2. A battery storage system according to claim 1, wherein the second control device reduces the total power according to a degree of fault of the sensor.

3. A battery storage system according to claim 2, wherein the second control device reduces the total power according to a number of sensors that have been determined as being faulty.

4. A battery storage system according to claim 2, wherein the second control device reduces the total power according to a type of the sensor that has been determined as being faulty.

5. A battery storage system according to claim 1, further comprising:
sensors that detect voltage and current of all of the battery modules.

6. A battery storage system according to claim 1, wherein the second control device includes a leakage detector.

7. A battery storage system according to claim 1, further comprising:
a positive side main contactor and a negative side main contactor for controlling electrical connection between the battery modules and positive and negative terminals on a chassis of the battery storage system.

* * * * *